(12) United States Patent
Izumi et al.

(10) Patent No.: US 7,642,612 B2
(45) Date of Patent: Jan. 5, 2010

(54) SEMICONDUCTOR DEVICE AND MANUFACTURING METHOD THEREOF

(75) Inventors: Konami Izumi, Kanagawa (JP); Mayumi Yamaguchi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 442 days.

(21) Appl. No.: 11/424,456

(22) Filed: Jun. 15, 2006

(65) Prior Publication Data

US 2006/0284183 A1    Dec. 21, 2006

(30) Foreign Application Priority Data

Jun. 17, 2005    (JP)    ............... 2005-178612

(51) Int. Cl.
*H01L 29/82*    (2006.01)
*H01L 23/58*    (2006.01)
(52) U.S. Cl. ................ 257/415; 257/635; 257/E29.324
(58) Field of Classification Search .................. 257/415, 257/635, E29.324
See application file for complete search history.

(56) References Cited

U.S. PATENT DOCUMENTS

| | | | |
|---|---|---|---|
| 5,403,772 A | 4/1995 | Zhang et al. |
| 5,888,858 A | 3/1999 | Yamazaki et al. |
| 5,985,740 A | 11/1999 | Yamazaki et al. |
| 6,063,654 A | 5/2000 | Ohtani |
| 6,077,731 A | 6/2000 | Yamazaki et al. |
| 6,093,934 A | 7/2000 | Yamazaki et al. |
| 6,100,562 A | 8/2000 | Yamazaki et al. |
| 6,180,439 B1 | 1/2001 | Yamazaki et al. |
| 6,465,287 B1 | 10/2002 | Yamazaki et al. |
| 6,528,820 B1 | 3/2003 | Yamazaki et al. |
| 6,744,069 B1 | 6/2004 | Yamazaki et al. |
| 6,813,054 B2 | 11/2004 | Aksyuk et al. |
| 6,860,939 B2 | 3/2005 | Hartzell |
| 7,056,381 B1 | 6/2006 | Yamazaki et al. |
| 2003/0196590 A1 | 10/2003 | Hartzell |
| 2003/0196591 A1 | 10/2003 | Hartzell |
| 2003/0196592 A1 | 10/2003 | Hartzell |
| 2003/0196593 A1 | 10/2003 | Hartzell |
| 2003/0197214 A1 | 10/2003 | Hartzell |
| 2003/0199177 A1 | 10/2003 | Hartzell |
| 2005/0130360 A1 | 6/2005 | Zhan et al. |
| 2005/0153475 A1 | 7/2005 | Hartzell |
| 2005/0205515 A1 | 9/2005 | Saga et al. |
| 2006/0181368 A1 | 8/2006 | Naniwada |
| 2006/0186512 A1* | 8/2006 | Dekker et al. ............... 257/635 |

(Continued)

FOREIGN PATENT DOCUMENTS

JP    2000-208018    7/2000

(Continued)

*Primary Examiner*—David S Blum
(74) *Attorney, Agent, or Firm*—Fish & Richardson P.C.

(57) ABSTRACT

It has been difficult to manufacture a semiconductor device equipped with a microstructure having a space, an electric circuit for controlling the microstructure, and the like over one substrate.

In a semiconductor device, a microstructure and an electric circuit for controlling the microstructure can be provided over one substrate by manufacturing the microstructure in such a way that a structural layer having polycrystalline silicon obtained by laser crystallization or thermal crystallization using a metal element is formed and processed at low temperature. As the electric circuit, a wireless communication circuit for carrying out wireless communication with an antenna is given.

33 Claims, 17 Drawing Sheets

U.S. PATENT DOCUMENTS

2006/0210106 A1* 9/2006 Pedersen .................... 381/355
2006/0218785 A1  10/2006 Horiuchi et al.
2006/0270238 A1  11/2006 Izumi et al.
2006/0274398 A1* 12/2006 Chou ........................ 359/247
2008/0105935 A1  5/2008 Ogura et al.

FOREIGN PATENT DOCUMENTS

JP        2004-001201        1/2004

* cited by examiner

5th space

5th space

SEMICONDUCTOR DEVICE AND MANUFACTURING METHOD THEREOF

BACKGROUND OF THE INVENTION

1. Field of Invention

The present invention relates to a semiconductor device which has a microstructure and a semiconductor integrated circuit over one substrate and which communicates with outside wirelessly. Moreover, the present invention relates to a method for manufacturing the semiconductor device.

2. Description of the Related Art

In recent years, research has been advanced on a micromachine system called MEMS. MEMS stands for Micro Electro Mechanical System, and this is sometimes called a micromachine, simply. A micromachine generally indicates a microdevice in which "a movable microstructure having a three-dimensional structure" and "an electric circuit having a semiconductor element" are integrated by using a semiconductor microprocessing technique. Unlike a semiconductor element, the microstructure has a movable part and a three-dimensional structure. Moreover, the microstructure can have a function of a switch, a variable capacitor, an actuator, or the like.

Since micromachines can control their own microstructures by electric circuits, it is considered that micromachines are not of central processing control type like a conventional device using a computer but micromachines can construct a distributed autonomous system that carries out a sequence of operations through an actuator and the like by processing information obtained by a sensor with the use of an electric circuit. A number of researches have been conducted on such micromachines (see Reference 1: Japanese Patent Laid-Open No. 2004-1201).

Meanwhile, with the progress of wireless communication techniques, development has been advanced on compact devices capable of sending and receiving information through wireless communication. Such a device includes a wireless chip for storing information in an electric circuit, a reader/writer for reading and writing information to be stored in the wireless chip, and a system for processing readout information and controlling the reader/writer. A wireless chip is also referred to as an RFID tag, an IC tag, a wireless tag, or various other names. A wireless chip is basically of nonbattery type and can carry out wireless communication with a reader/writer by obtaining drive electric power through an electromagnetic wave from the reader/writer. In recent years, a number of researches have been conducted on the wireless chips and identification information control techniques using the wireless chips.

It has been difficult to manufacture, by equivalent processes, a microstructure and a semiconductor element that form the above micromachine. This is because manufacturing of a microstructure needs a process of etching a sacrifice layer and so on, which are different from a process for manufacturing a semiconductor element.

Moreover, a semiconductor element often has a protective film and wiring thereover, and in such a case, how the microstructure is sealed is very important.

In this way, since different processes are necessary, there is a risk that the microstructure or semiconductor element may be broken so that the micromachine does not work. Thus, such a micromachine is currently put into practical use that the microstructure and the semiconductor element are manufactured in different steps.

SUMMARY OF THE INVENTION

Therefore, it is an object of the present invention to provide a micromachine (hereinafter referred to as a semiconductor device) having a microstructure and a semiconductor element over one insulating substrate.

Moreover, it is an object of the present invention to provide a semiconductor device in which a microstructure, a semiconductor integrated circuit for controlling the microstructure, and a wireless communication circuit for carrying out wireless communication are formed over one substrate and which can send and receive information through wireless communication by obtaining drive electric power through wireless communication from outside.

Moreover, it is an object of the present invention to provide a method for manufacturing the semiconductor device.

In view of the above objects, a semiconductor device of the present invention includes a microstructure and an electric circuit integrally formed over an insulating surface, wherein the electric circuit can receive electric power and a signal through wireless communication using an antenna. The microstructure has a structural layer having polycrystalline silicon obtained by laser crystallization or thermal crystallization using a metal element. Such polycrystalline silicon can also be applied to a semiconductor element that forms the electric circuit. The insulating surface indicates a surface of a glass substrate, a plastic substrate, or a conductive or semiconductor substrate over which a protective film having an insulating property is formed. The structural layer has a three-dimensional structure for forming the microstructure and a space is provided between the structural layer and a layer provided over or under the structural layer. Such a space allows the microstructure to have a movable portion.

The present invention specifically has the following means.

A semiconductor device of the present invention has an antenna, a microstructure, and an electric circuit over an insulating surface, wherein the antenna and the microstructure are respectively connected to the electric circuit, wherein the microstructure has a structural layer having polycrystalline silicon obtained by laser crystallization or thermal crystallization using a metal element, and wherein the microstructure has a space between the insulating surface and the structural layer.

A semiconductor device of the present invention includes an antenna, a microstructure, and an electric circuit over an insulating surface, wherein the antenna and the microstructure are respectively connected to the electric circuit, wherein the microstructure has a lower layer and a structural layer which have a conductive property, wherein one of the lower layer and the structural layer has polycrystalline silicon obtained by laser crystallization or thermal crystallization using a metal element, and wherein the microstructure has a space between the lower layer and the structural layer.

The structural layer according to the present invention is obtained by laser crystallization or thermal crystallization using one or more of metal elements selected from Ni (nickel), Fe (iron), Ru (ruthenium), Rh (rhodium), Pd (palladium), Os (osmium), Ir (iridium), Pt (platinum), Cu (copper), and Au (gold). When crystallization is carried out using such a metal element, temperature at a crystallization step can be lowered; therefore, a substrate having a lower distortion point such as a glass substrate can be used.

The structural layer can have a single-layer structure including polycrystalline silicon obtained by laser crystallization or thermal crystallization using a metal element or a multilayer structure including the polycrystalline silicon. For example, the structural layer may have a multilayer structure including the polycrystalline silicon and one or more selected from amorphous silicon and silicide. In the multilayer structure, a plurality of polycrystalline silicon, a plurality of amorphous silicon, and a plurality of silicide may be provided. As the silicide, silicide including the metal element used for crystallizing silicon and silicide including a different metal element from the metal element used for the crystallization can be employed.

The structural layer may be selectively provided with a region having polycrystalline silicon. For example, the structural layer can include the region having polycrystalline silicon and a region including one or more selected from amorphous silicon and silicide.

In the semiconductor device of the present invention, the electric circuit has a wireless communication circuit and a processing circuit, wherein the antenna is connected to the wireless communication circuit and the microstructure is connected to the processing circuit.

Moreover, the electric circuit may have a semiconductor element and a microstructure, wherein the antenna is connected to the electric circuit.

The electric circuit further includes a power source circuit, a clock generating circuit, a demodulating circuit, a modulating circuit, an information judging circuit, a memory, a memory controlling circuit, an arithmetic circuit, and a microcrystal controlling circuit.

The semiconductor device of the present invention can have a substrate which faces the insulating surface (the substrate is referred to as a counter substrate). Moreover, the counter substrate can have a protective layer. The protective layer can be provided in a portion which faces a region where the microstructure is not provided.

The antenna in the semiconductor device of the present invention can be provided to the counter substrate. The antenna can be connected to the electric circuit.

Moreover, the microstructure can have a space by etching away wholly or partially a sacrifice layer having a metal element, a metal element compound, silicon, silicon oxide, silicon nitride, or silicon oxynitride. Such a space can be regarded as being in contact with the structural layer. In other words, the sacrifice layer indicates a layer to be etched away. Then, by a space formed by etching away the sacrifice layer after forming a multilayer structure that forms the microstructure, the movable portion of the microstructure can be operated. Moreover, in the case of using a conductive material such as a metal element or a metal element compound for the sacrifice layer, a part of the sacrifice layer can be used as a conductive layer.

For example, the microstructure of the present invention has a space (referred to as a first space) between the structural layer and the insulating surface.

Moreover, the microstructure has the first space between the structural layer and the insulating layer and a space (referred to as a second space) between the structural layer and a layer provided over the structural layer.

The microstructure has a lower layer having a conductive property over the insulating surface and a space (referred to as a third space) between the structural layer and the lower layer.

The microstructure has the lower layer having a conductive property over the insulating surface, the third space between the structural layer and the lower layer, and the second space between the structural layer and the layer provided over the structural layer.

The lower layer in the microstructure of the present invention can be formed with a conductive material such as a metal element, a metal element compound, silicide, or silicon having an impurity, and functions as a lower electrode. The lower electrode can apply voltage or the like to control the movable structural layer.

The structural layer is preferably processed, i.e., patterned to have a shape whose corners are round when viewed from above. Moreover, the structural layer is preferably formed so that its cross section has a tapered angle.

A method for manufacturing a semiconductor device of the present invention includes the steps of forming a first sacrifice layer in a first region over an insulating surface; forming a layer having silicon in a second region and over the first sacrifice layer in the first region; crystallizing the layer having silicon by laser crystallization or thermal crystallization using a metal element; forming a structural layer in the first region and a semiconductor layer in the second region by patterning the crystallized layer having silicon; forming a first insulating layer over the structural layer and the semiconductor layer; forming a first conductive layer over the first insulating layer; forming a gate electrode in the second region by patterning the first conductive layer; and forming a first space between the insulating surface and the structural layer by etching away the first sacrifice layer. The first region is a region where a microstructure is to be formed and the second region is a region where a semiconductor element is to be formed.

A method for manufacturing a semiconductor device of the present invention includes the steps of forming a first sacrifice layer in a first region over an insulating surface; forming a layer having silicon over the first sacrifice layer; crystallizing the layer having silicon by laser crystallization or thermal crystallization using a metal element; forming a structural layer in the first region and a semiconductor layer in a second region by patterning the crystallized layer having silicon; forming a first insulating layer over the structural layer and the semiconductor layer; forming a first conductive layer over the first insulating layer; forming a second sacrifice layer in the first region and a gate electrode in the second region by patterning the first conductive layer; forming a second insulating layer over the second sacrifice layer and the gate electrode; forming a first contact hole in the second insulating layer; forming a second conductive layer over the second insulating layer; forming a wire for connecting the first region and the second region by patterning the second conductive layer; forming a second contact hole in the second insulating layer to partially expose the first sacrifice layer and the second sacrifice layer; and forming a first space between the insulating surface and the structural layer and a second space between the structural layer and the second insulating layer by introducing etchant through the second contact hole and etching away the first sacrifice layer and the second sacrifice layer.

In the above method for manufacturing a semiconductor device, the first conductive layer serving as a lower layer can be formed over the insulating surface and the first sacrifice layer can be formed over the first conductive layer.

Moreover, a method for manufacturing a semiconductor device of the present invention includes the steps of forming a layer having silicon over an insulating surface; crystallizing the layer having silicon by laser crystallization or thermal crystallization using a metal element; forming a lower layer in a first region and a semiconductor layer in a second region by patterning the crystallized layer having silicon; forming a third sacrifice layer over the lower layer; forming a first insulating layer over the lower layer and the semiconductor layer; forming a first conductive layer over the third sacrifice layer; forming a structural layer in the first region and a gate electrode in the second region by patterning the first conductive layer; and forming a third space between the lower layer and the structural layer by etching away the third sacrifice layer.

A method for manufacturing a semiconductor device of the present invention includes the steps of forming a layer having silicon over an insulating surface; crystallizing the layer having silicon by laser crystallization or thermal crystallization using a metal element; forming a lower layer in a first region and a semiconductor layer in a second region by patterning the crystallized layer having silicon; forming a first insulating layer over the lower layer and the semiconductor layer; forming a third sacrifice layer in the first region over the first insulating layer; stacking a third conductive layer and a fourth conductive layer over the first insulating layer and the third sacrifice layer; forming a structural layer and a fourth sacrifice layer in the first region and a gate electrode in the second region by patterning a fifth conductive layer and a sixth conductive layer; forming a second insulating layer over the fourth sacrifice layer and the gate electrode; forming a first contact hole in the second insulating layer; forming a second conductive layer over the second insulating layer; forming a wire for connecting the first region and the second region by patterning the second conductive layer; forming a second contact hole in the second insulating layer so as to partially expose the third sacrifice layer and the fourth sacrifice layer; and forming a second space and a third space in contact with the structural layer by etching away the third sacrifice layer and the fourth sacrifice layer.

In the method for manufacturing a semiconductor device of the present invention, a protective layer may be formed in a portion over a counter substrate which faces a region where the microstructure is not provided, and the insulating surface and the counter substrate may be pasted so as to face each other.

The above method for manufacturing a semiconductor device of the present invention may further include the steps of forming a fifth conductive layer functioning as an antenna over a counter substrate; forming a protective layer over the fifth conductive layer in a portion which faces a region where the structural layer is not provided; forming a third contact hole in the protective layer; patterning a sixth conducive layer so as to fill the third contact hole; and making the insulating surface and the counter substrate face each other so as to electrically connect a wiring layer and the sixth conductive layer.

In the method for manufacturing a semiconductor device of the present invention, the layer having silicon can be formed by stacking one or more selected from polycrystalline silicon, amorphous silicon, and silicide. The layer having silicon can be crystallized by adding a metal element onto amorphous silicon and irradiating with a laser a region where the metal element has been added. The metal element can be added wholly or selectively.

As the metal element, one or more selected from Ni, Fe, Ru, Rh, Pd, Os, Ir, Pt, Cu, and Au can be used.

In the method for manufacturing a semiconductor device of the present invention, the first sacrifice layer and the second sacrifice layer can be formed with the same material and etched away in the same step. Similarly, the third sacrifice layer and the fourth sacrifice layer can be formed with the same material and etched away at the same time.

In the method for manufacturing a semiconductor device of the present invention, the structural layer and any of the first to fourth sacrifice layers are preferably formed so as to have polygonal shapes whose corners are round when viewed from above and tapered shapes at their cross sections.

According to the present invention, a semiconductor device in which a microstructure and a semiconductor element are formed over one substrate can be provided by using polycrystalline silicon obtained by crystallization using a metal element such as nickel for the structural layer of the microstructure and an active layer of the semiconductor element. Since the microstructure formed in this way can resist external force and stress, the microstructure can be formed over one substrate with the semiconductor element.

By manufacturing a microstructure and a semiconductor element over one substrate, a semiconductor device which does not require to be assembled and packaged and does not require high manufacturing cost can be provided.

Moreover, the present invention can provide a semiconductor device having a wireless communication circuit which enables control or power supply through wireless communication. Therefore, since the semiconductor device does not require wires for control or power supply to be connected to the semiconductor device, the semiconductor device can operate physically independently and have high degree of freedom. Thus, the provision of a central processing arithmetic circuit and the like for controlling the microstructure makes it possible to provide a semiconductor device which carries out a sequence of operations: detection, judgment, and act only by wireless communication control.

DETAILED DESCRIPTION OF THE INVENTION

Figure 1A:
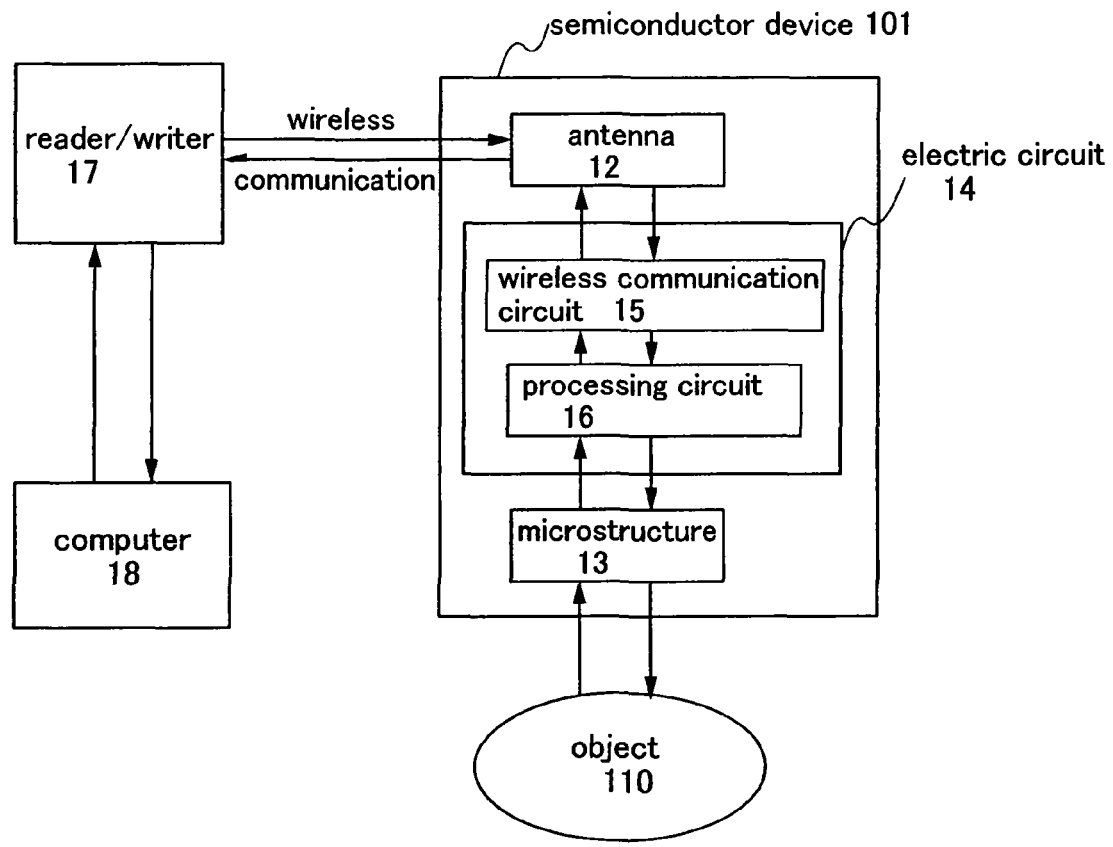
FIGS. 1A and 1B show a semiconductor device of the present invention.

Embodiment modes and embodiment will be hereinafter described with reference to the drawings. However, since it is easily understood by those skilled in the art that the mode and detail can be variously changed without departing from the scope and spirit of the present invention, the present invention is not limited to the following description. Therefore, the present invention is not construed as being limited to the description of embodiment modes and embodiment hereinafter shown. On the description of the present invention with reference to the drawings, a reference numeral indicating the same part is used in common throughout different drawings.

EMBODIMENT MODE 1

Embodiment Mode 1 will describe a semiconductor device of the present invention with reference to the drawings.

A semiconductor device of the present invention can control identification information using wireless communication. In other words, a semiconductor device of the present invention is provided with a wireless chip capable of controlling identification information using wireless communication. A semiconductor device provided with a wireless chip can carry out wireless communication with a reader/writer by obtaining drive electric power through an electromagnetic wave emitted from the reader/writer. Therefore, the semiconductor device of the present invention can be of nonbattery type. However, the semiconductor device of the present invention may have a battery or the like mounted in order to make up for drive electric power.

FIG. 1A shows a structure of a semiconductor device of the present invention. A semiconductor device 101 of the present invention includes an antenna 12, a microstructure 13, and an electric circuit 14. The electric circuit 14 has a wireless communication circuit 15 and a processing circuit 16. The antenna 12 is connected to the wireless communication circuit 15, so that a signal and the like can be exchanged. The microstructure 13 is connected to the processing circuit 16, so that a signal and the like can be exchanged.

When the antenna 12 and the wireless communication circuit 15 approach a reader/writer 17, the antenna 12 can receive an electromagnetic wave emitted from the reader/writer 17 and obtain drive electric power for driving the semiconductor device 101. The antenna 12 can send and receive information to and from the reader/writer 17 using an electromagnetic wave. The processing circuit 16 can control the microstructure 13 based on the information received from the reader/writer 17, process information which the microstructure 13 has received from an object 110, and so on. The processing circuit 16 can have a so-called feedback mechanism. In the feedback mechanism, information which has been received from the microstructure 13 and processed and information which has been received from the reader/writer 17 are processed in combination to control the microstructure 13.

The microstructure 13 connected to the processing circuit 16 is a structure functioning as, for example, a sensor or an actuator. Because of its minute structure, scaling law can apply to the microstructure 13, whereby the microstructure 13 can capture a minute change of the object 110 and convert the change into a signal.

The reader/writer 17 has functions of supplying drive electric power to the semiconductor device 101 through an electromagnetic wave and sending and receiving information to and from the semiconductor device 101 through an electromagnetic wave. The operation of the reader/writer 17 is controlled by a system, for example, a computer 18 herein. The reader/writer 17 and the computer 18 can use wire communication connected through a communication line such as a USB (Universal Serial Bus) or wireless communication using an infrared ray or the like.

Figure 1B:
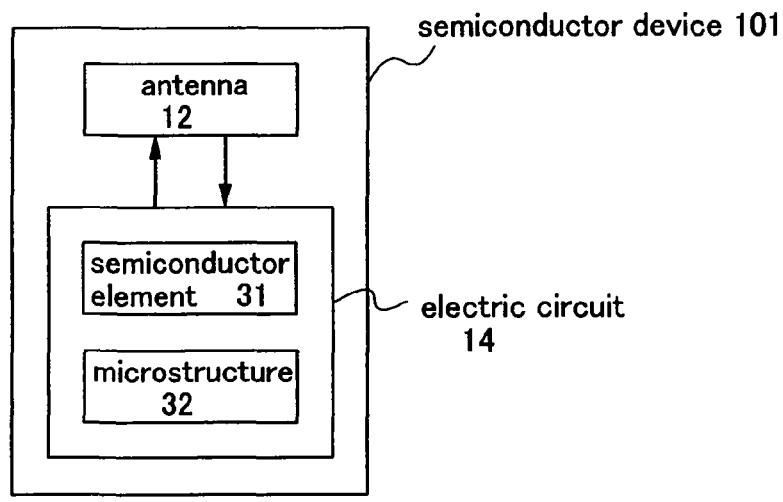

Moreover, the semiconductor device 101 of the present invention can use a microstructure for the electric circuit. For example, as shown in FIG. 1B, the semiconductor device 101 has the antenna 12 and the electric circuit 14 which can be formed by a semiconductor element 31 and a microstructure 32. The electric circuit 14 has a wireless communication circuit, a processing circuit, and the like similarly to FIG. 1A, and the antenna is connected to a circuit having a wireless communication function in the electric circuit 14. Here, the microstructure 32 that forms the electric circuit 14 can function as, for example, a switch or a capacitor. By forming the circuit using the microstructure 32 which functions as a switch or a capacitor and which has high response speed, wireless communication using higher frequency can be carried out.

The semiconductor device 101 of the present invention has the antenna 12 and the wireless communication circuit 15 as shown in the figure, whereby a wire for inputting drive electric power and a control signal from outside is not provided and the semiconductor device is not connected to the others physically. That is to say, the semiconductor device 101 of the present invention is capable of wireless communication.

Figure 2:
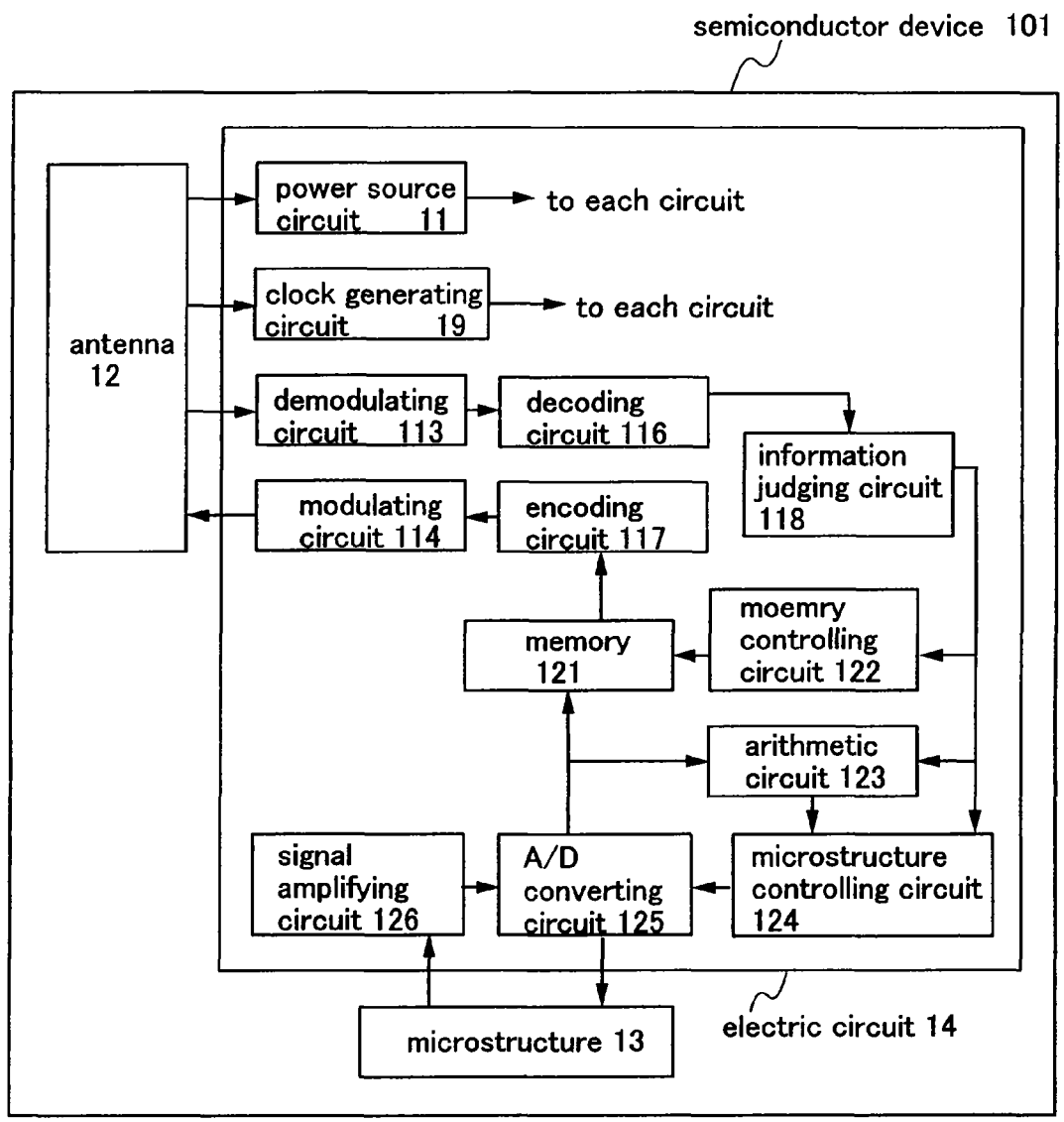
FIG. 2 shows a semiconductor device of the present invention.

FIG. 2 shows a detailed structure of the electric circuit 14 of the semiconductor device 101. The electric circuit 14 has functions of receiving an electromagnetic wave emitted from outside such as the reader/writer 17 to generate electric power for driving the semiconductor device 101, and carrying out wireless communication with outside. Therefore, the electric circuit 14 has a power source circuit 11, a clock generating circuit 19, a modulating circuit 113, a demodulating circuit 114, a decoding circuit 116, an encoding circuit 117, an information judging circuit 118, and the like, which are necessary for wireless communication. Moreover, in some cases, the semiconductor device has a different structure depending on frequency or a communication method used for the wireless communication.

Moreover, the electric circuit 14 has functions of controlling the microstructure 13, processing information from the reader/writer 17, and so on. Therefore, the electric circuit 14 has a memory, a memory controlling circuit, an arithmetic circuit, and the like. FIG. 2 shows a structure in which the electric circuit 14 has a memory 121, a memory controlling circuit 122, an arithmetic circuit 123, a microstructure controlling circuit 124, an A/D converting circuit 125, and a signal amplifying circuit 126.

The power source circuit 11 has a diode and a capacitor and can hold constant voltage by rectifying alternating voltage generated at the antenna 12 and supply the constant voltage to each circuit. The clock generating circuit 19 has a filter or a frequency dividing circuit, whereby a clock with required frequency can be generated based on alternating voltage generated at the antenna 12 and the clock can be supplied to each circuit. Here, frequency of the clock generated by the clock generating circuit 19 is basically set to be equal to or lower than frequency of an electromagnetic wave that the reader/writer 17 and the semiconductor device 101 use for the communication. Moreover, the clock generating circuit 19 has a ring oscillator and can generate a clock with arbitrary frequency by inputting voltage from the power source circuit 11.

The demodulating circuit 113 has a filter and an amplifying circuit, so that a signal included in alternating voltage generated at the antenna 12 can be demodulated. The demodulating circuit 113 has a circuit having a different structure depending on a modulation method used for the wireless communication. The decoding circuit 116 decodes a signal which has been demodulated by the demodulating circuit 113. This decoded signal is a signal which has been sent from the reader/writer 17. The information judging circuit 118 has a comparing circuit and the like, and can judge whether the decoded signal is a correct signal that has been sent from the reader/wrier 17. If the signal is judged to be correct information, the information judging circuit 118 can send a signal showing that the signal is correct to each circuit such as the memory controlling circuit 122, the arithmetic circuit 123, or the microstructure controlling circuit 124, and the circuit having received the signal can carry out predetermined operation.

The encoding circuit 117 encodes data to be sent from the semiconductor device 101 to the reader/writer 17. The modulating circuit 114 modulates the encoded data and sends the modulated data to the reader/writer 17 through the antenna 12.

The data to be sent to the reader/writer is data unique to the semiconductor device stored in a memory or data obtained by a function of the semiconductor device. The data unique to the semiconductor device is data such as identification information, and the data obtained by a function of the semiconductor device is, for example, data obtained by the microstructure, data to which certain calculation has been conducted based on the data obtained by the microstructure, and the like. Such data are stored in a memory in the semiconductor device, for example a nonvolatile memory.

The memory 121 can have a volatile memory and a nonvolatile memory and store data unique to the semiconductor device 101 (identification information), information obtained from the microstructure 13, and the like. Although FIG. 2 shows only one memory 121, it is possible to have a plurality of memories in accordance with the kind of information to be stored and a function of the semiconductor device 101. The memory controlling circuit 122 has a function of controlling the memory 121 in the case of reading information stored in the memory 121 and writing information in the memory 121. Specifically, the memory controlling circuit 122 can generate a writing signal, a reading signal, a memory selecting signal, and the like, and specify an address, and so on.

The microstructure controlling circuit 124 can generate a signal for controlling the microstructure 13. For example, in the case of controlling the microstructure 13 in accordance with an instruction from the reader/writer 17, a signal for controlling the microstructure 13 is generated based on the signal decoded by the decoding circuit 116. In the case where data such as a program for controlling operation of the microstructure 13 is stored in the memory 121, a signal for controlling the microstructure 13 is generated based on the data read from the memory 121. Besides, it is possible to provide a feedback function for generating a signal for controlling the microstructure 13 based on data in the memory 121, data from the reader/writer 17, and data obtained from the microstructure 13.

The arithmetic circuit 123 can process data obtained from the microstructure 13, for example. Moreover, the arithmetic circuit 123 can carry out information processing and the like in the case where the microstructure controlling circuit 124 has a feedback function. The A/D converting circuit 125 is a circuit for converting analog data and digital data and transmits a control signal to the microstructure 13. Alternatively, the A/D converting circuit 125 can convert data from the microstructure 13 and transmit the data to each circuit. The signal amplifying circuit 126 can amplify a weak signal obtained from the microstructure 13 and transmits the amplified signal to the A/D converting circuit 125.

Although the electric circuit has the wireless communication circuit 15 and the processing circuit 16 in FIG. 1A, it is difficult to clearly discriminate, in some cases, where the wireless communication circuit 15 ends and where the processing circuit 16 starts in a detailed circuit shown in FIG. 2. This is because, for example, the memory 121 can be provided to one or both of the wireless communication circuit 15 and the processing circuit 16. More specifically, the electric circuit 14 can have a nonvolatile and nonrewritable memory for storing information unique to the semiconductor device and a nonvolatile and rewritable memory for storing data which controls the microstructure and data which is obtained from the microstructure. The nonvolatile and nonrewritable memory can be provided as the wireless communication circuit 15 and the nonvolatile and rewritable memory can be provided as the processing circuit 16.

Therefore, the electric circuit 14 has the wireless communication circuit 15, which is a circuit for carrying out wireless communication, and the processing circuit 16 for processing an instruction from the reader/writer 17 that controls the microstructure 13. As specific circuits for achieving those functions, the power source circuit 11, the memory 121, and the like described with reference to FIG. 2 are given. Whether these circuits form the wireless communication circuit 15 or the processing circuit 16 changes in accordance with the function and the like of the semiconductor device 101.

The semiconductor device 101 of the present invention is not limited to the specific example mentioned above. In other words, the semiconductor device 101 has the wireless communication circuit 105 that carries out wireless communication by obtaining electric power for driving the semiconductor device 101 from outside through wireless communication, the processing circuit 16 having a semiconductor element and controlling the microstructure 13, and the microstructure 13 controlled by the processing circuit 16, and other structures of the semiconductor device are not limited. Moreover, the semiconductor device 101 of the present invention has an antenna and the electric circuit 14, and the electric circuit 14 can be formed by a semiconductor element 131 and the microstructure 32.

Conventionally, in the case of treating a minute object having a size of submillimeter, such a process has been necessary that a structure of the minute object is expanded first, information processing and operation setting are carried out based on information obtained by a person or a computer, and the operation is reduced in size and sent to the minute object.

In contrast, the semiconductor device of the present invention described above makes it possible to treat a minute object by only transmission of a dominant concept instruction from a person or a computer. In other words, once a person or a computer determines a purpose and sends an instruction, the semiconductor device can work so that information on an object is obtained by using a sensor or the like and information processing is carried out.

This embodiment mode has explained the case where the object is minute. For example, the object itself is assumed to have a size of meter and include a weak signal emitted from the object (such as a small change of light or pressure) and so on. The semiconductor device of the present invention includes a microstructure and an electric circuit and can have a size of micrometer to millimeter. If the semiconductor device is incorporated in a mechanical device as a component or if a general user treats the semiconductor device, the semiconductor device may have a size of meter so as to be easily treated at assembly or easily used.

EMBODIMENT MODE 2

A microstructure provided in a semiconductor device of the present invention has different shape and structure depending on a function of the semiconductor device. This embodiment mode will describe a case where the microstructure functions as a sensor, an actuator, or a switch.

Figure 3A:
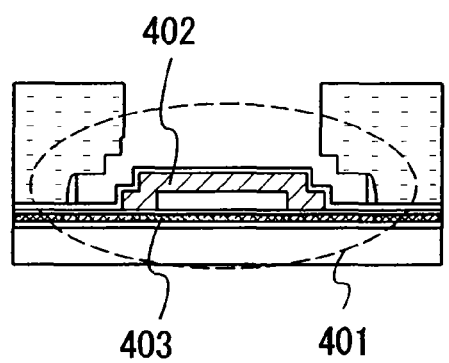
FIGS. 3A and 3B are cross-sectional views showing microstructures provided to a semiconductor device of the present invention.

For example, a sensor can detect concentration, pressure, flow rate, or the like of an object. As an example of a typical structure of a microstructure having a function as a sensor, as shown in FIG. 3A, a microstructure 401 in which a structural layer 402 is provided over a substrate and a space is provided between the substrate and the structural layer 402 is given. When force is applied from outside to the microstructure having such a structure, the structural layer is deformed to change capacitance held between a lower layer and the structural layer. By detecting the change of the capacitance, applied force can be measured. The amount of change of the capacitance can be known by measuring potential of the lower layer. A lower layer 403 having a conductive property may be provided below the structural layer 402, and the lower layer 403 can be used as an electrode. When the lower layer 403 is used as an electrode, it is possible to control movement of the structural layer 402 by applying voltage to the lower layer 403.

Figure 3B:
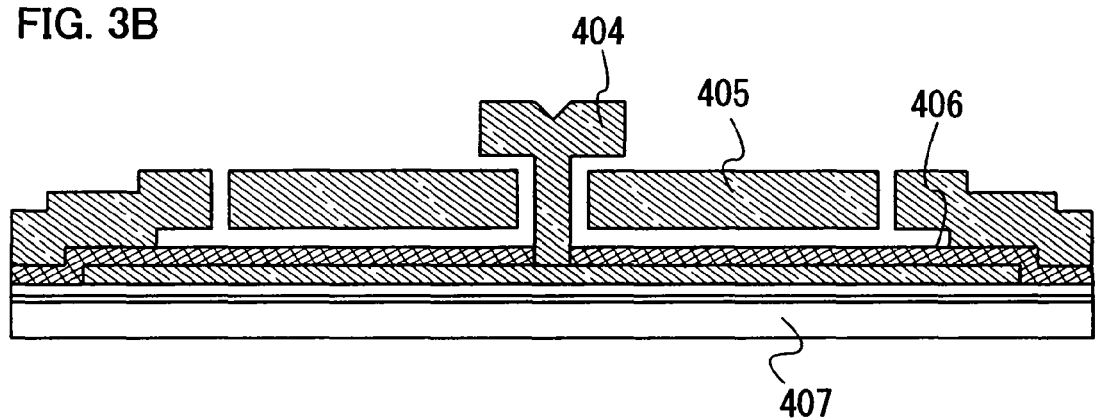

Next, an actuator is described. An actuator is to change an electric signal to kinetic energy (mechanical energy). Typically, gearwheel driven by force of static electricity (electrostatic force) can be given (see FIG. 3B). FIG. 3B shows a cross section of the gearwheel. The actuator shown in FIG. 3B is provided with a rotator 405 that rotates along an axis 404 provided over a substrate 407. The rotator 405 can move in a space provided below or beside the rotator 405. The rotator and the axis can be formed with polycrystalline silicon.

In order to make the rotator move easily, a low friction layer 406 may be provided on a plane adjacent to the rotator 405. The low friction layer 406 can be formed with diamond-like carbon (DLC).

Figure 4A:
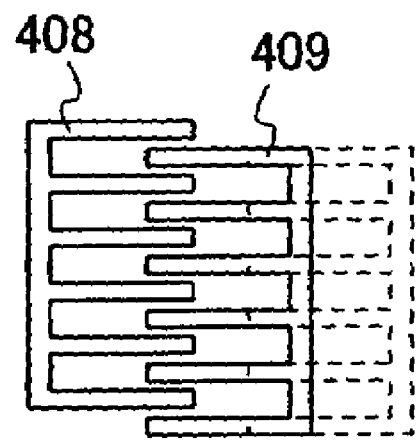
FIGS. 4A and 4B are cross-sectional views showing microstructures provided to a semiconductor device of the present invention.

Moreover, a structure is given where structural layers each having a comb shape are engaged to each other and distance between the structural layers is changed by electrostatic force (see FIG. 4A). FIG. 4A shows a structure in which a fixed electrode 408 and a movable electrode 409 are engaged to each other, and electrostatic attracting force works between the electrodes by applying voltage between the fixed electrode 408 and the movable electrode 409, thereby moving the movable electrode 409 toward the fixed electrode 408.

Figure 4B:
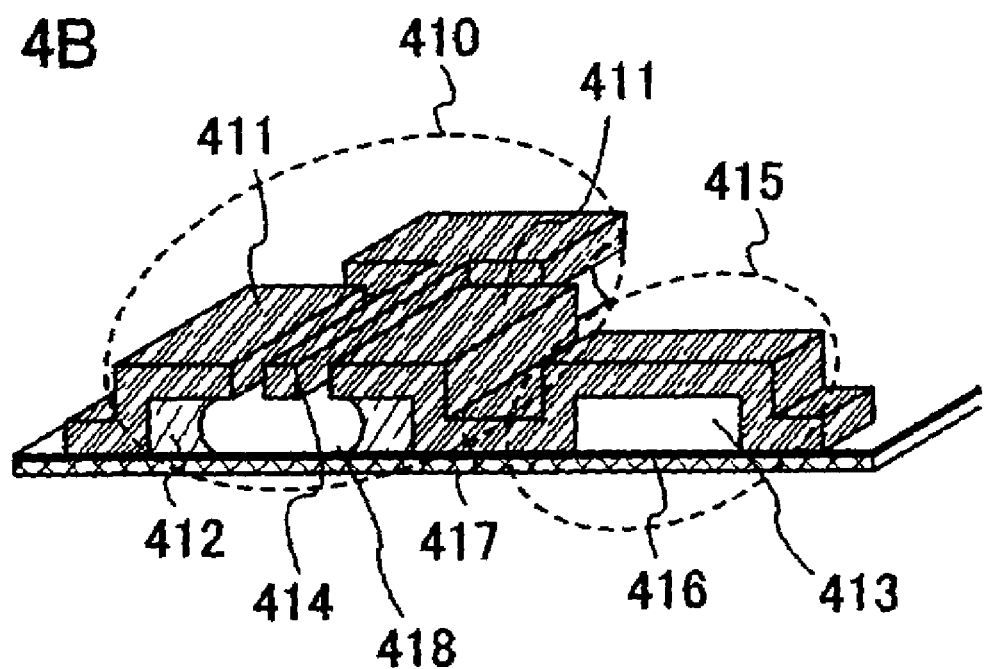

As a switch, a switch having a structure in which adhesion and separation of conductive layers are controlled by using a control electrode and which can physically determine electric connection or disconnection is given (see FIG. 4B). The switch shown in FIG. 4B has a switch element 410 and a microstructure 415 provided over a substrate. The switch element 410 has a control electrode 411, a space 418 obtained by removing a sacrifice layer 412, a structural layer 417, and a cantilever 414. The cantilever 414 can move because of the existence of the space 418. The microstructure 415 has a lower electrode 416 and a space 413 obtained by removing the sacrifice layer. The microstructure 415 can function as a capacitor element for holding a charge by the lower electrode 416 and the structural layer 417. Moreover, since the structural layer 417 can move, the microstructure 415 can function as a sensor or a switch. The microstructure 415 can be used as a memory element. It is to be noted that the structural layer 417 can be used in common in the microstructure 415 and the switch element 410.

By using such microstructures in combination, semiconductor devices having various functions can be manufactured. For example, it is possible to obtain functions of detecting a particular substance by a sensor of the microstructure and capturing the substance with an actuator, or moving a semiconductor device by an actuator until a sensor detects a particular substance.

The semiconductor device having the above structure according to the present invention can be used for maintenance of machines. The semiconductor device can form a sensor and an automotive actuator by microstructures, move while detecting a defective portion inside a machine using a sensor, process information obtained from the sensor using a processing circuit, and communicate with outside by using a wireless communication circuit in the case of obtaining information that the defective portion has been found. Moreover, it is possible to mend the defective portion by cooperating with a plurality of semiconductor devices.

This embodiment mode can be freely combined with the above embodiment mode.

EMBODIMENT MODE 3

This embodiment mode will describe an example of using a microstructure for a wireless communication circuit.

In order to carry out wireless communication, the wireless communication circuit has a passive element such as an inductor or a capacitor and an active element such as a switch, in addition to a semiconductor element typified by a transistor. These elements can be manufactured in accordance with a technique for manufacturing a semiconductor element; however, some problems are caused. For example, the transistor used as a switch element has problems that difference in input voltage at ON state and OFF state cannot be increased, response speed cannot be raised, and so on.

However, it is considered that these problems can be solved by manufacturing these elements with the use of microstructures. For example, a switch manufactured by using a microstructure can completely insulate a signal transmission route at OFF state. Moreover, a control electrode of the switch and the signal transmission route can be completely insulated. Furthermore, an advantage that the response speed gets higher by a scaling law is obtained. Thus, the semiconductor device 101 of the present invention can have the microstructure 32 in the electric circuit 14.

This embodiment mode can be freely combined with the above embodiment mode.

EMBODIMENT MODE 4

This embodiment mode will describe a method for manufacturing a semiconductor device of the present invention. A semiconductor device of the present invention has a microstructure and a semiconductor element over an insulating surface, and here a method for manufacturing a microstructure and a semiconductor element over one substrate will be described with reference to the drawings. In the drawings, a top view is shown on an upper side while a cross-sectional view taken along a line O-P or Q-R of the top view is shown on a lower side. Moreover, a wireless communication circuit can be formed by using a semiconductor element formed over an insulating surface.

A microstructure and a semiconductor element provided in a semiconductor device of the present invention can be manufactured over a substrate having an insulating surface. Here, the substrate having an insulating surface is a glass substrate, a quartz substrate, a plastic substrate, or the like. Moreover, it is possible to use a conductive substrate made of a metal element or the like or a semiconductor substrate made of silicon or the like, over which a layer formed with a material having an insulating property is provided. By forming the microstructure and the semiconductor element over a plastic substrate, a lightweight, thin, and highly flexible semiconductor device can be manufactured. Further, when a glass substrate where a semiconductor device is manufactured is thinned by a method of polishing from a rear surface of the substrate or another method, a lightweight and thin semiconductor device can also be formed.

Figure 5A:
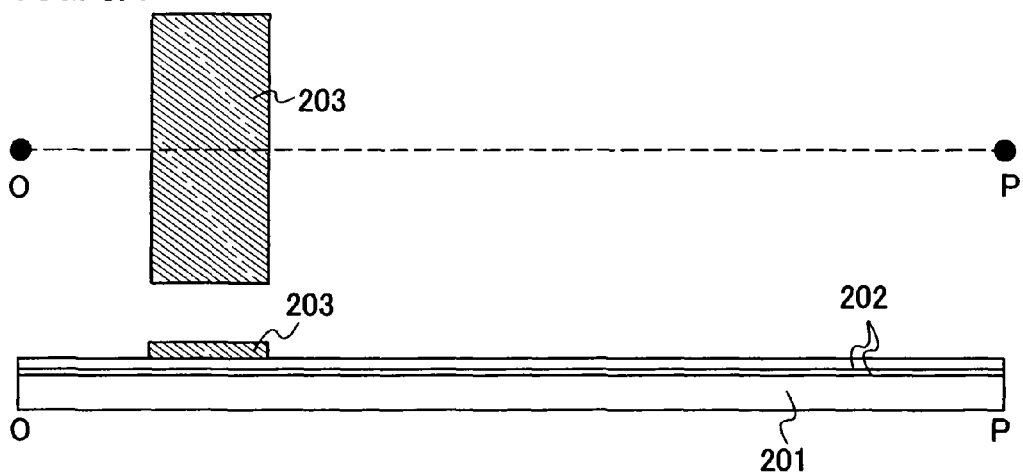
FIGS. 5A to 5C show manufacturing steps of a semiconductor device of the present invention.

First, a base layer 202 is formed over a substrate 201 having an insulating surface (see FIG. 5A). The base layer 202 can be formed in a single-layer or multilayer structure with an insulating material such as silicon oxide, silicon nitride, or silicon oxynitride. In this embodiment mode, the base layer 202 has a two-layer structure.

As a first layer of the base layer 202, a silicon oxynitride layer having a thickness of 10 to 200 nm (preferably 50 to 100 nm) is formed. The silicon oxynitride layer can be formed by a plasma CVD method using $SiH_4$, $NH_3$, $N_2O$, and $H_2$ as reactive gas. Next, as a second layer of the base layer 202, a silicon oxynitride layer having a thickness of 50 to 200 nm (preferably 100 to 150 nm) is formed. The silicon oxynitride layer can be formed by a plasma CVD method using $SiH_4$ and $N_2O$ as reactive gas.

Next, a sacrifice layer (corresponding to a first sacrifice layer) for forming a microstructure is formed over the base layer 202 and then patterned into an arbitrary shape (see FIG. 5A). Such a sacrifice layer is provided to form a space included in the microstructure. In other words, a space included in the microstructure can be formed by removing the sacrifice layer through etching or the like. The space can be regarded as a space in contact with a structural layer because the space is manufactured over or under the structural layer. The first sacrifice layer 203 can be formed with an element such as metal or silicon or a compound thereof, for example tungsten or silicon nitride, by a sputtering method, a CVD method, or the like. Patterning can be carried out in such a way that a resist mask is formed by a photolithography method and then anisotropic dry etching is conducted.

The thickness of the first sacrifice layer 203 can be determined in consideration of various factors such as a material of the first sacrifice layer 203, structure and operation method of the microstructure, and etching method and etchant for the sacrifice layer. For example, if the first sacrifice layer 203 is too thin, etchant does not diffuse so that the first sacrifice layer 203 is not etched or the structural layer after the etching is buckled (the microstructure is attached to the substrate). Meanwhile, if the sacrifice layer is too thick, in the case of operating the microstructure by electrostatic force, the microstructure cannot be driven by electrostatic force because the space formed after removing the sacrifice layer is too large. In consideration of these factors, for example, in the case of forming a microstructure driven by electrostatic force between the structural layer and a conductive layer formed under the first sacrifice layer 203, the first sacrifice layer 203 preferably has a thickness of 0.5 to 3 µm, more preferably 1 to 2 µm.

Moreover, if a material which is easily peeled from the base layer 202 because of strong internal stress, low adhesiveness, and the like, a thick layer cannot be formed at one time. In the case of forming the first sacrifice layer 203 by using such a material, film formation and patterning can be repeated to form the first sacrifice layer 203 thick.

Figure 5B:
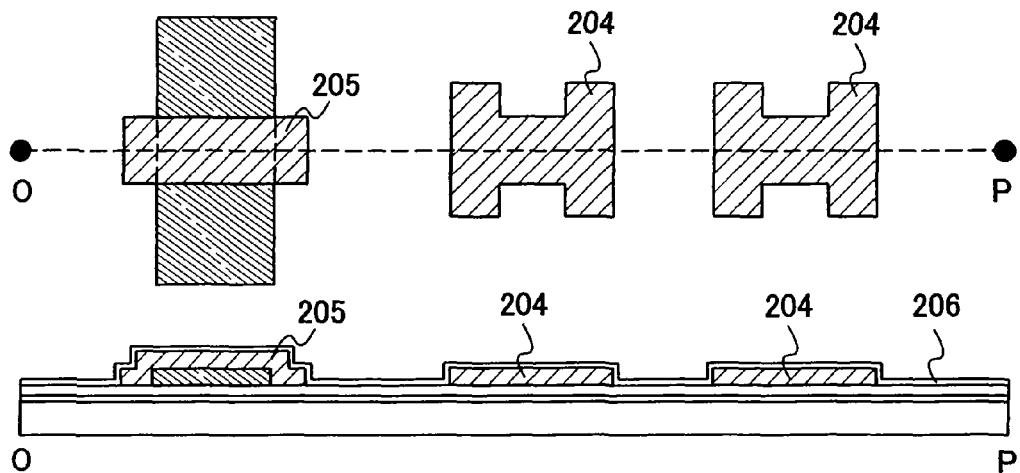

Next, a silicon layer to be a semiconductor layer 204 that forms the semiconductor element, and a structural layer 205 that forms the microstructure is formed and processed, i.e., patterned into a desired shape (see FIG. 5B). The silicon layer (the semiconductor layer 204 and the structural layer 205 are collectively referred to as a silicon layer) can be formed with a material having silicon, and can be formed by using a silicon layer having a crystalline condition, a silicon layer having an amorphous condition, a silicon layer having a microcrystal condition, or the like. In this embodiment mode, a silicon layer having an amorphous condition is formed, a metal element is added to the silicon layer, and crystallization is carried out by laser irradiation or a heat treatment, thereby forming a silicon layer having a crystalline condition.

To crystallize the silicon layer, a heat treatment for heating in a heating furnace, a heat treatment with light emitted from a lamp, laser irradiation, or the like is employed. Any of these or a combination thereof can be used for the crystallization. If a heating furnace is used for the heat treatment, the silicon layer having an amorphous condition is heated at 400 to 550° C. for 2 to 20 hours. At this time, the temperature is set at multiple stages in the range of 400 to 550° C. so that the temperature gets higher gradually. Since hydrogen and the like contained in the silicon layer having an amorphous condition are released by an initial low-temperature heat process at about 400° C., it is possible to reduce roughness of a surface of the layer at crystallization.

The laser irradiation can be carried out by using a continuous wave laser beam (CW laser beam) or a pulsed laser beam. As the laser beam, one or more selected from an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser can be used. By delivering a fundamental wave of such a laser beam or any of second to fourth harmonics of the fundamental wave, a silicon layer having a crystal with large grain size can be obtained. For example, a second harmonic (532 nm) or a third harmonic (355 nm) of a $Nd:YVO_4$ laser (fundamental wave: 1064 nm) can be used. At this time, a laser energy density of about 0.01 to 100 $MW/cm^2$ (preferably 0.1 to 10 $MW/cm^2$) is necessary. The scan speed is set to about 10 to 2000 cm/s.

A CW laser beam with a fundamental wave and a CW laser beam with a harmonic may be delivered, or a CW laser beam with a fundamental wave and a pulsed laser beam with a harmonic may be delivered. By delivering a plurality of laser beams, an energy region of a wide range can be covered. Moreover, it is also possible to use a pulsed laser beam emitted with a repetition rate that is set so that a pulsed laser beam can be delivered before a silicon layer having an amorphous condition is melted by the previous laser beam and after the melted silicon layer is solidified. By emitting a laser beam with such repetition rate, it is possible to obtain a silicon layer having crystal grains grown continuously toward a scan direction. The repetition rate of such a laser beam is 10 MHz or higher, which is much higher than a repetition rate used in general ranging from several tens to several hundred Hz.

In the above thermal crystallization or laser crystallization step, a metal element for promoting crystallization of a silicon layer, for example nickel, is added. For example, a solution containing nickel is applied onto the silicon layer having an amorphous condition and then a crystallization step is carried out. By conducting thermal crystallization using the metal element, heat temperature for the crystallization can be decreased and moreover a silicon layer in which crystal grain boundaries are continuous can be obtained. Here, as the metal element for promoting the crystallization, Fe, Ru, Rh, Pd, Os, Ir, Pt, Cu, Au, or the like can also be used besides nickel.

Since a metal element for promoting crystallization becomes a contaminant source for a semiconductor device, it is desirable that a gettering step be carried out to remove the metal element after crystallizing the silicon layer. In the gettering step, after crystallizing the silicon layer, a layer serving as a gettering sink is formed over the silicon layer, and the metal element is moved to the gettering sink through a heat treatment. As the gettering sink, a polycrystalline semiconductor layer or a semiconductor layer with an impurity added can be used. For example, a polycrystalline semiconductor layer in which an inert element such as argon is added onto a silicon layer is formed, and this polycrystalline semiconductor layer can be used as a gettering sink. By adding the inert element, the polycrystalline semiconductor layer is distorted, thereby gettering the metal element more efficiently. Moreover, by forming a semiconductor layer to which an element such as phosphorus is added, the metal element can be gettered.

The silicon layer manufactured through the above gettering step can be used as the semiconductor layer 204 and the structural layer 205. Moreover, it is possible to add an impurity element such as phosphorus, arsenic, or boron in the same step as that for forming an impurity region in the semiconductor layer 204, in the case where the structural layer 205 needs to have a conductive property. If a microstructure to be controlled by electrostatic force is manufactured, it is preferable that the structural layer 205 have a conductive property.

The thickness of the structural layer 205 can be determined in consideration of various factors such as thickness of the first sacrifice layer 203, a material of the structural layer 205, a structure of the microstructure, and a method of etching the sacrifice layer. For example, if the structural layer 205 is formed with a material having large difference in distribution of internal stress, the structural layer 205 is warped. However, this warp of the structural layer 205 can be utilized to form the microstructure. Moreover, if the structural layer 205 is formed thick, distribution is generated in internal stress, which may become a cause of warp or buckle. On the contrary, if the structural layer 205 is thin, there is a risk that the microstructure is buckled by surface tension of a solution used at etching of the sacrifice layer, or the like. Thus, in the case of manufacturing the structural layer 205 using a silicon layer having a crystalline condition of this embodiment mode, it is preferable that the film thickness be from 0.5 to 01 μm.

In the case of forming a thick silicon layer for the structural layer 205, it is possible to form a thick silicon layer at one time, and also possible to form a thick layer by stacking silicon layers. At this time, the silicon layer can be formed by stacking a layer having polycrystalline silicon which is obtained by crystallization using the above step (hereinafter referred to as the layer having polycrystalline silicon) and a layer having amorphous silicon. Moreover, it is possible to use a silicon layer having a metal element for promoting crystallization. The silicon layer having a metal element for promoting crystallization forms so-called silicide. Thus, silicide including the metal element used for promoting crystallization or silicide including a different metal element from the metal element used for promoting crystallization can be employed.

Polycrystalline silicon has high toughness, whereby crack is difficult to be generated in the material and the generated crack is unlikely to spread. Moreover, as shown in the aforementioned step, since the layer having polycrystalline silicon obtained by crystallization using a metal element for promoting crystallization has continuous crystal grain boundaries, toughness thereof is higher than that of a layer having polycrystalline silicon obtained by crystallization without using a metal element. Although amorphous silicon has low toughness, the strength is high and plastic deformation is unlikely to be caused. Meanwhile, amorphous silicon has an advantage that amorphous silicon can be easily formed by a CVD method or a sputtering method. Moreover, silicide has high strength and a conductive property. By selectively forming the structural layer using these silicon layers having different characteristics, it is possible to manufacture a microstructure in accordance with the structure and function.

Subsequently, a first insulating layer 206 is formed over the semiconductor layer 204 and the structural layer 205 (see FIG. 5B). Similarly to the base layer 202, the first insulating layer 206 can be formed with an insulating material such as silicon oxide, silicon nitride, or silicon oxynitride by a plasma CVD method, a sputtering method, or the like. In this embodiment mode, a silicon oxynitride layer (composition ratio: Si=32%, O=59%, N=7%, H=2%) is formed with a thickness of 50 nm by a plasma CVD method. Needless to say, the first insulating layer 206 is not limited to the silicon oxynitride film and another insulating layer may be formed in a single-layer or multilayer structure.

As a material for the first insulating layer 206, metal oxide having a high dielectric constant, such as hafnium (Hf) oxide can be used. By forming the first insulating layer 206 using such a high dielectric constant material, the semiconductor element can be driven at low voltage and power consumption of the semiconductor device can be reduced.

The first insulating layer 206 can be formed by a high-density plasma treatment. The high-density plasma treatment is a plasma treatment under a condition where plasma density is $1\times10^{11}$ cm$^{-3}$ or higher, preferably $1\times10^{11}$ to $9\times10^{15}$ cm$^{-3}$, and high frequency such as microwaves (for example a frequency of 2.45 GHz) is used. If plasma is generated under such a condition, low electron temperature increases from 0.2 to 2 eV. Since high-density plasma at low electron temperature has low kinetic energy of active species, a film having little plasma damage and few defects can be formed.

In a film-forming chamber capable of such a plasma treatment, the substrate where the semiconductor layer 204 and the structural layer 205 are formed is set while setting distance between a body to which a film is to be formed and an electrode for generating plasma, i.e., an antenna to 20 to 80 mm, preferably 20 to 60 mm. Such a high-density plasma treatment achieves a low-temperature process (substrate temperature of 400° C. or lower); therefore, glass or plastic having low heat resistance can be used for the substrate 201.

A film-forming atmosphere for such an insulating layer can be nitrogen atmosphere or oxygen atmosphere. The nitrogen atmosphere is a mixed atmosphere of nitrogen and noble gas or a mixed atmosphere of nitrogen, hydrogen, and noble gas. As the noble gas, at least one of helium, neon, argon, krypton, and xenon can be used. The oxygen atmosphere is typically a mixed atmosphere of oxygen and noble gas, a mixed atmosphere of oxygen, hydrogen, and noble gas, or a mixed atmosphere of dinitrogen monoxide and noble gas. As the noble gas, at least one of helium, neon, argon, krypton, and xenon can be used.

By applying such steps, it is possible to suppress damage given to another film and to form a dense insulating layer. The insulating layer formed by a high-density plasma treatment can improve a condition of an interface between the insulating layer and a layer in contact with the insulating layer. In other words, by employing a high-density plasma treatment, a condition of interfaces between the first insulating layer 206 and the semiconductor layer 204 and between the first insulating layer 206 and the structural layer 205 can be improved. Accordingly, electrical characteristics of the semiconductor element can be improved. Furthermore, the microstructure having the structural layer 205 having high strength can be manufactured.

Here, although a case of using the high-density plasma treatment to form the first insulating layer 206 has been described, the high-density plasma treatment may be applied to the semiconductor layer 204 and the structural layer 205. By the high-density plasma treatment, surfaces of the semiconductor layer 204 and the structural layer 205 can be modified. Accordingly, electrical characteristics of the semiconductor element and the microstructure can be enhanced. Furthermore, the high-density plasma treatment can be applied not only to the formation of the first insulating layer 206 but also to the formation of the base layer 202 and another insulating layer.

Figure 5C:
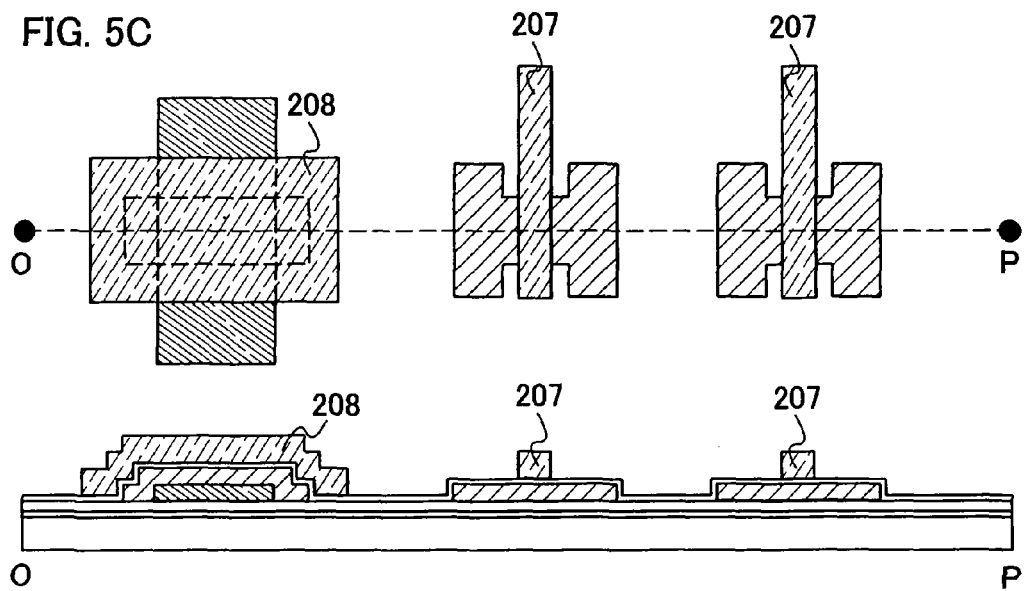

Next, a first conductive layer to be a gate electrode 207 forming the semiconductor element, and a second sacrifice layer 208 for forming the microstructure is formed over the first insulating layer 206 and patterned into an arbitrary shape (see FIG. 5C). The first conductive layer (the gate electrode 207 and the second sacrifice layer 208 are collectively referred to as the first conductive layer) is formed with a metal element having a conductive property such as tungsten or a metal compound by a sputtering method, a CVD method, or the like.

The first conductive layer becomes the gate electrode 207 of the semiconductor element. Therefore, it is possible to stack first conductive layers using a plurality of conductive materials in consideration of a conductive property, workability, or the like. FIG. 5C shows an example in which the first conductive layer is formed in a single-layer structure.

The first conductive layer becomes the second sacrifice layer 208 for forming the microstructure. In the case of etching the second sacrifice layer 208 at the same time as the first sacrifice layer 203, it is desirable that the first sacrifice layer 203 and the second sacrifice layer 208 be formed with the same material. However, the present invention is not limited to these materials but may be manufactured with the same material or different materials.

The gate electrode 207 and the second sacrifice layer 208 are patterned by forming a resist mask formed by a photolithography method, and carrying out anisotropic dry etching. As an example of the dry etching, an ICP (Inductively Coupled Plasma) etching method can be used. As etching gas, chlorine-based gas typified by $Cl_2$, $BCl_3$, $SiCl_4$, $CCl_4$, or the like; fluorine-based gas typified by $CF_4$, $SF_6$, $NF_3$, or the like; or $O_2$ can be appropriately used. In the case of forming the first conductive layer with a plurality of conductive materials, the first conductive layers can be etched by appropriately adjusting an etching condition (electric power to be applied to a coil-shaped electrode, electric power to be applied to an electrode on the substrate 201 side, electrode temperature on the substrate 201 side, and the like).

Next, an N-type impurity region 112 and a P-type impurity region 111 are formed by adding an impurity element to the semiconductor layer 204 that forms the semiconductor element. Such impurity regions can be selectively formed by forming a resist mask formed by a photolithography method and adding an impurity element. As a method for adding the impurity element, an ion doping method or an ion implantation method can be employed. As the impurity element imparting N-type conductivity, typically phosphorus (P) or arsenic (As) is used, and as the impurity element imparting P-type conductivity, boron (B) can be used. It is desirable that the N-type impurity region 212 and the P-type impurity region 111 have a concentration of an impurity element imparting N-type conductivity in the range of $1\times10^{20}$ to $1\times10^{21}/cm^3$.

Subsequently, an insulating layer is formed with a nitrogen compound such as silicon nitride or oxide such as silicon oxide by a plasma CVD method or the like, and the insulating layer is anisotropically etched in a perpendicular direction, thereby forming an insulating layer 209 in contact with a side surface of the gate electrode 207 (hereinafter the insulating layer 209 is referred to as a sidewall) (see FIG. 7A). Next, an impurity element is added to the semiconductor layer 204 having the N-type impurity region 212 to form a high-concentration N-type impurity region 112 having higher impurity concentration than the N-type impurity region 212 provided under the sidewall 209. By providing difference in impurity concentration in this way using the sidewall 209, a short-channel effect caused by shortening gate length of a semiconductor element can be prevented.

In the case of manufacturing the gate electrode 207 by stacking different conductive materials so as to have a tapered shape, it is not necessary to form the sidewall 209. This is because, in this case, the N-type impurity region 212 and the high-concentration N-type impurity region 112 can be formed by adding impurity elements once.

After forming the impurity regions, a heat treatment, infrared light irradiation, or laser irradiation is carried out for activating the impurity element. At the same time as the activation, plasma damage to the first insulating layer 206 and plasma damage to the interface between the first insulating layer 206 and the semiconductor layer 204 can be recovered. In particular, effective activation can be carried out when the impurity element is activated by using an excimer laser from a top or rear surface in an atmosphere from room temperature to 300° C. Moreover, the activation may be conducted by delivering a second harmonic of a YAG laser, which is a favorable activation means because maintenance is not often required.

Further, hydrogenation can be carried out by a heat treatment, infrared light irradiation, or laser irradiation after forming a passivation film by using an insulating layer such as a silicon oxynitride film or a silicon oxide film so as to cover the semiconductor layer 204 or the conductive layer to become the gate electrode 207. For example, a silicon oxynitride film is formed in 100 nm thick by a plasma CVD method, and then a heat treatment is conducted using a clean oven at 300 to 550° C. for 1 to 12 hours, thereby hydrogenating the semiconductor layer. For example, a heat treatment is conducted using a clean oven in a nitrogen atmosphere at 410° C. for 1 hour. This step can terminate dangling bonds in the semiconductor layer 204 caused by adding the impurity element, with hydrogen contained in the passivation film. At the same time, the aforementioned activation process of the impurity region can be carried out.

Figure 7A:
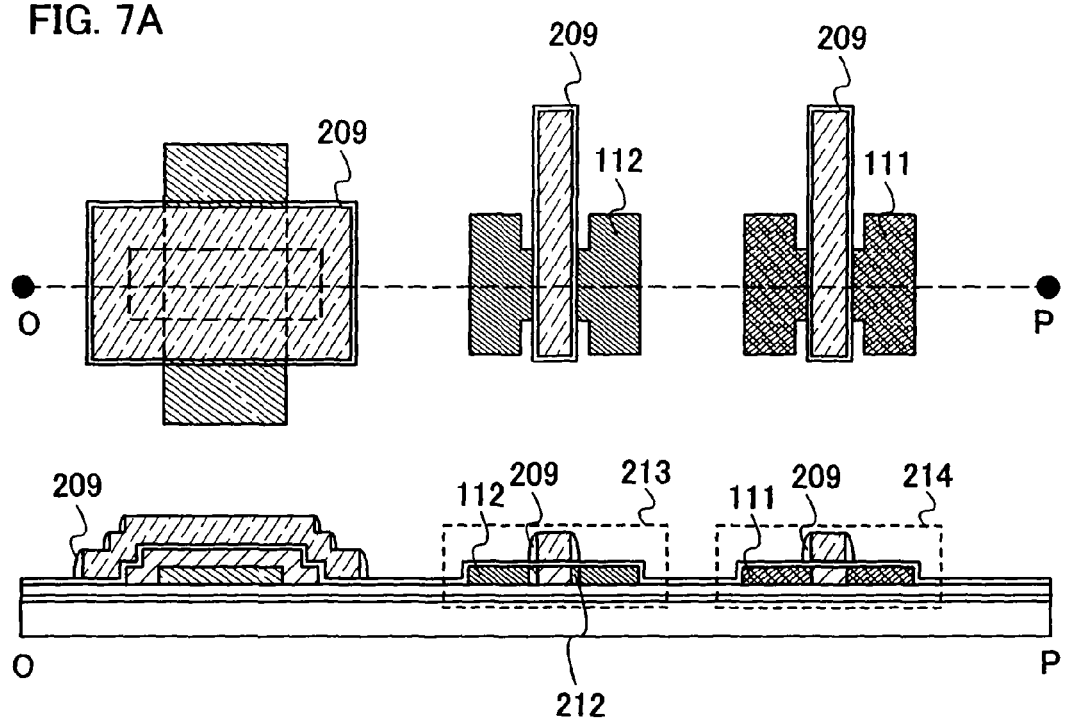
FIGS. 7A and 7B show manufacturing steps of a semiconductor device of the present invention.

In accordance with the above steps, an N-type semiconductor element 213 and a P-type semiconductor element 214 are formed (see FIG. 7A). The structural layer 205 forming the microstructure may have an impurity region formed in a region not covered with the second sacrifice layer 208.

Subsequently, an insulating layer 215 is formed so as to cover the whole (see FIG. 7B). The insulating layer 215 can be formed with an inorganic or organic material having an insulating property, or the like. As the inorganic material, silicon oxide or silicon nitride can be used. As the organic material, polyimide, acrylic, polyamide, polyimide amide, resist, benzocyclobutene, siloxane, or polysilazane can be used. A siloxane resin corresponds to a resin including a Si—O—Si bond. Siloxane has a skeletal structure including a bond of silicon (Si) and oxygen (O). As a substituent, an organic group including at least hydrogen (such as an alkyl group or aromatic hydrocarbon) can be used. As a substituent, a fluoro group may be used. Moreover, as a substituent, an organic group including at least hydrogen and a fluoro group may be used. Polysilazane is formed by using a polymer material having a bond of silicon (Si) and nitrogen (N) as a starting material.

Figure 7B:
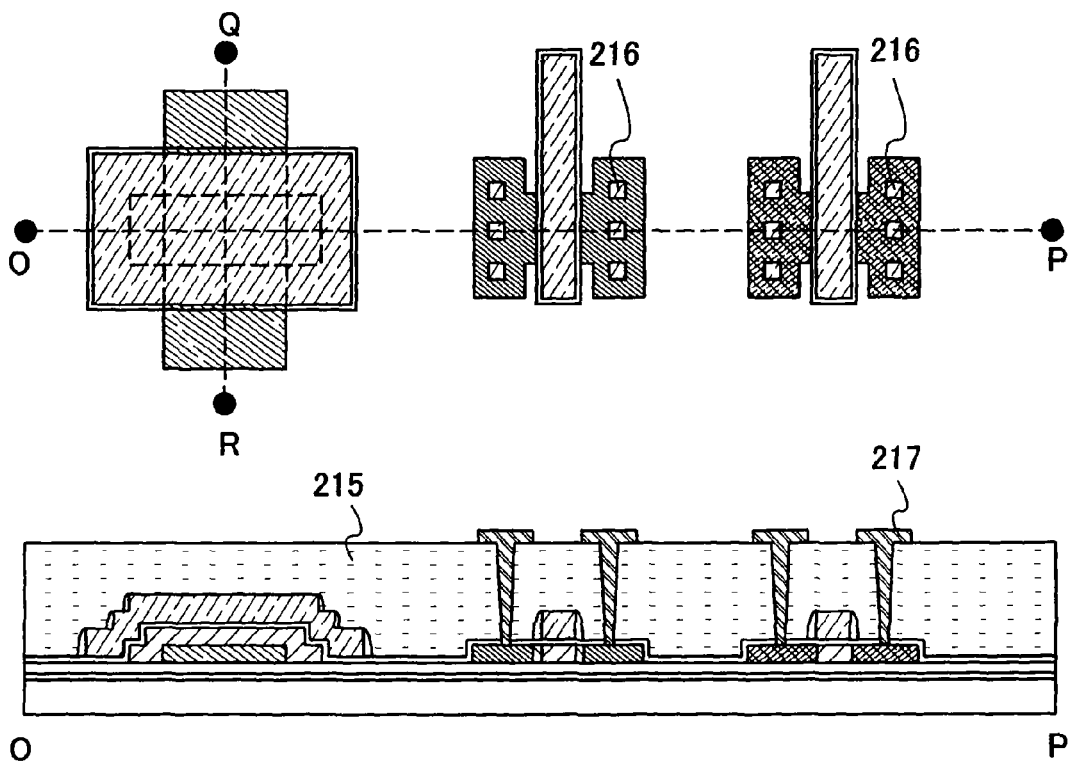

Next, the insulating layer 215 and the first insulating layer 206 are etched sequentially to form a first contact hole 216 (see a top view of FIG. 7B). As the etching process, a dry etching process or a wet etching process can be applied. In this embodiment mode, the first contact hole 216 is formed by dry etching.

Next, a second conductive layer is formed over the insulating layer 215 and the first contact hole 216 and patterned into an arbitrary shape, thereby forming a wire 217 that forms a source electrode, a drain electrode, and an electric circuit (see a cross-sectional view in FIG. 7B). The wire 217 can be formed by using a film including an element such as aluminum (Al), titanium (Ti), molybdenum (Mo), tungsten (W), or silicon (Si), or an alloy film using the element.

Figure 8A:
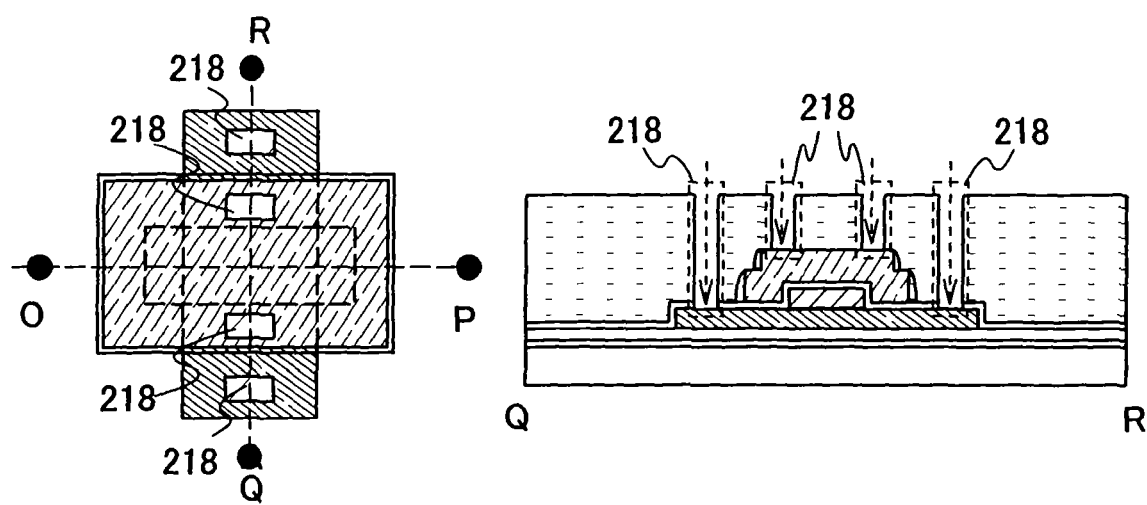
FIGS. 8A to 8C show manufacturing steps of a semiconductor device of the present invention.

Next, the insulating layer 215 and the first insulating layer 206 are sequentially etched to form a second contact hole 218, whereby the first sacrifice layer 203 and the second sacrifice layer 208 are exposed (see FIG. 8A). It is to be noted that only a microstructure is shown in FIG. 8A.

As the etching process, a dry etching process or a wet etching process can be applied. In this embodiment mode, the second contact hole 218 is formed by dry etching. The second contact hole 218 is opened in order to etch away the first sacrifice layer 203 and the second sacrifice layer 208. Therefore, the diameter of the second contact hole 218 is determined so that etchant flows therethrough. For example, it is preferable that the diameter of the second contact hole 218 be 2 μm or more.

Further, the second contact hole 218 can be formed as a contact hole having large diameter so that the first sacrifice layer 203 and the second sacrifice layer 208 are easily etched. In other words, it is not necessary to form a small contact hole as shown in FIG. 8A but the second contact hole 218 may be formed so as to expose the whole sacrifice layer while leaving a portion where the insulating layer 215 is necessary (for example, the insulating layer over the semiconductor element, and the like).

Subsequently, the first sacrifice layer 203 and the second sacrifice layer 208 are etched away (see FIGS. 8B and 8C). The sacrifice layers can be etched through the second contact hole 218 by using wet etchant or by dry etching, whichever is suitable for a material of the sacrifice layer. In the etching step, it is necessary to select an appropriate combination of a material for the structural layer 205, materials for the first sacrifice layer 203 and the second sacrifice layer 208, and etchant for removing the sacrifice layers. For example, if etchant is determined to be a particular one, the first sacrifice layer 203 and the second sacrifice layer 208 may be formed by using a material having higher etching rate than a material for the structural layer 205.

If the sacrifice layer is formed with tungsten (W), the sacrifice layer can be etched by soaking the sacrifice layer for about 20 minutes in a solution in which 28% of ammonia and 31% of hydrogen peroxide are mixed in the ratio of 1:2. If the sacrifice layer is formed with silicon dioxide, buffered fluorinated acid in which a water solution including 49% of fluorinated acid and ammonium fluoride are mixed in the ratio of 1:7 can be used. If the sacrifice layer is formed with silicon, phosphoric acid; metal hydride such as KOH, NaOH, or CsOH; $NH_4OH$; hydrazine; EPD (a mixture of ethylene diamine, pyrocatechol, and water); TMAH; IPA; an $NMD_3$ solution; or the like can be used. In order to prevent buckle of the microstructure due to capillarity at drying after wet etching, rinse is carried out using an organic solvent with low viscosity (such as cyclohexane) or drying is carried out at low temperature and low pressure. Alternatively, these may be combined. Moreover, freeze drying is also effective.

In order to prevent buckle of the microstructure due to capillary, a plasma treatment for providing a water-repellent property to a surface of the microcrystal may be conducted. The sacrifice layer can be etched by dry etching with the use of $F_2$ or $XeF_2$ under a condition of high pressure such as atmospheric pressure. Here, if the first sacrifice layer 203 and the second sacrifice layer 208 are formed with different materials and cannot be etched with the same etchant, it is necessary to etch the sacrifice layers in two steps. In this case, a selective ratio between the sacrifice layers and the layers in contact with the etchant which are not etched away (such as the structural layer 205 and the insulating layer 215) needs to be considered carefully.

Figure 8B:
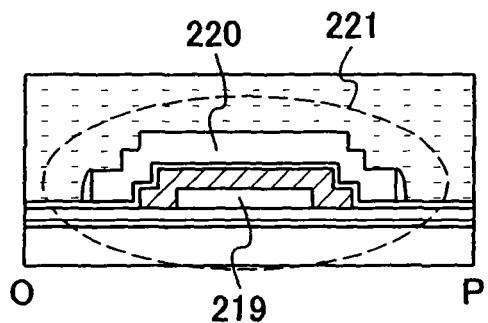
Figure 8C:
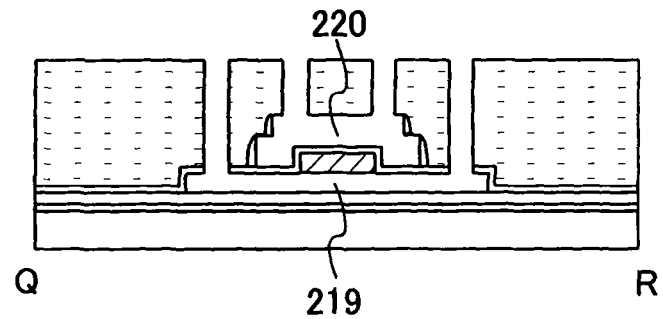

By using such a step, the first sacrifice layer 203 is removed to form a first space 219 and the second sacrifice layer 208 is etched away to form a second space 220, whereby a microstructure 221 can be manufactured (see FIGS. 8B and 8C). Here, the microstructure 221 has the first space 219 provided between the structural layer 205 and the substrate 201 having an insulating property and has the second space 220 provided between the structural layer 205 and the insulating layer 215 formed over the structural layer 205. The structural layer 205 of the microstructure 221 can be moved by having such a structure.

In the case of laser crystallization or crystallization by a combination of a laser and nickel like in the above step, the crystallization can be carried out at lower temperature than crystallization only by heat. Thus, a range of materials applicable to the process can be expanded. For example, in the case of crystallizing the semiconductor layer only by heat, it is necessary to heat the semiconductor layer at about 1000° C. for about 1 hour and a glass substrate sensitive to heat or a metal element of which a melting point is 1000° C. or less cannot be used. However, by employing the above step, a glass substrate having a distortion point of 593° C. or the like can be used.

Since the semiconductor layer manufactured by the above steps has continuous crystal grain boundaries as compared with the semiconductor layer formed by only thermal crystallization, covalent bonds are also continuous. Therefore, stress concentration that is generated because of defects caused by unpaired bond between the grain boundaries does not occur, which increases breaking stress as compared with normal polycrystalline silicon.

Amorphous silicon is unlikely to be plastic-deformed despite of its low toughness. That is, amorphous silicon can be regarded as being hard like glass but brittle. Since laser crystallization is conducted in the present invention, it is possible to separately form amorphous silicon and polycrystalline silicon depending on a location on the substrate 201. This makes it possible to manufacture a microstructure in which polycrystalline silicon having continuous grain boundaries, which is superior in toughness, and amorphous silicon, which is unlikely to be plastic-deformed, are combined.

Moreover, since amorphous silicon generally has internal residual stress after film formation, it is difficult to form amorphous silicon thick. Meanwhile, since polycrystalline silicon manufactured by the above steps can have internal stress relaxed and can be formed at low temperature, a semiconductor layer having arbitrary thickness can be formed by repeating film formation and crystallization. Moreover, another material can be patterned over the semiconductor layer and another semiconductor layer can be formed thereover.

It is known that silicon alloy such as nickel silicide has high strength in general. By selectively leaving nickel in the semiconductor layer and applying appropriately a heat treatment, a microstructure which is harder and has a higher conductive property can be manufactured. Therefore, the structural layer 205 can be thinned, whereby a microstructure with high operation speed and superior reactivity can be provided.

According to the present invention, furthermore, a semiconductor device which does not require to be assembled or packaged and does not require high manufacturing cost can be provided by manufacturing the microstructure and the semiconductor element over one substrate.

This embodiment mode can be freely combined with the above embodiment mode.

EMBODIMENT MODE 5

In the case of moving a microstructure by electrostatic force, a lower layer 222 is preferably formed below the base layer 202. In this embodiment mode, a structure in which a lower layer including a conductive material is provided below the base layer will be described.

Figure 9A:
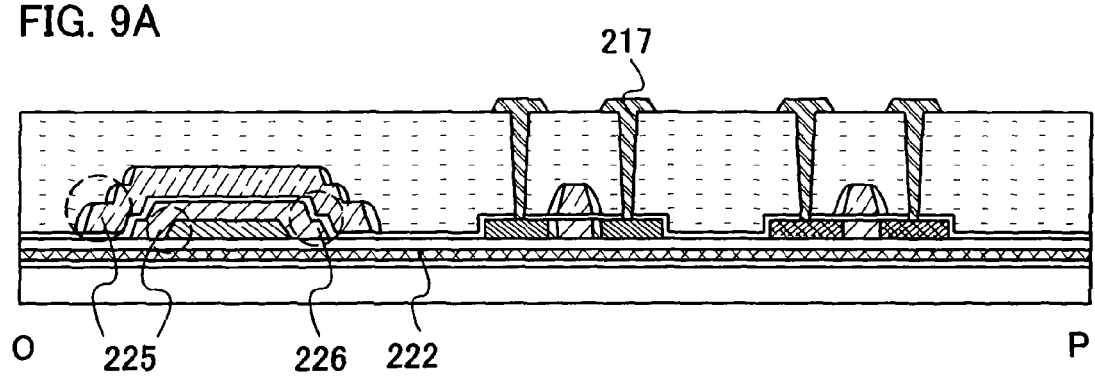
FIGS. 9A and 9B show manufacturing steps of a semiconductor device of the present invention.

First, the lower layer 222 having a conductive property is formed between the base layer 202 and the substrate 201 (see FIG. 9A). The lower layer 222 can be used as a common electrode, a control electrode, or the like. The lower layer 222 can be formed with a metal element such as tungsten or a conductive material by a CVD method or the like. Moreover, the lower layer 222 may be patterned into an arbitrary shape as necessary. If the base layer 202 has a multilayer structure, the base layer 222 may be interposed between the base layers 202.

Although the semiconductor layer to be the semiconductor layer 204, and the structural layer 205 is formed over the first sacrifice layer 203 in the above steps, it is possible to form an insulating layer over the first sacrifice layer 203 and then form the semiconductor layer. By using this step, the structural layer 205 can be protected by the insulating layer when removing the first sacrifice layer 203 to reduce damage to the structural layer 205.

The lower layer provided in this way can be used as a common electrode or a control electrode in the case of moving a microstructure by electrostatic force.

The first sacrifice layer 203 and the second sacrifice layer 208 can be formed to have a tapered shape 225 when viewed from a cross section (see FIG. 9A). Moreover, the structural layer 205 can also be formed to have the tapered shape 225 when viewed from a cross section (see a cross-sectional view of FIG. 9A). In this way, since the sacrifice layer has a tapered cross section, generation and attachment of dust in the etching and washing steps and the like can be reduced.

Figure 9B:
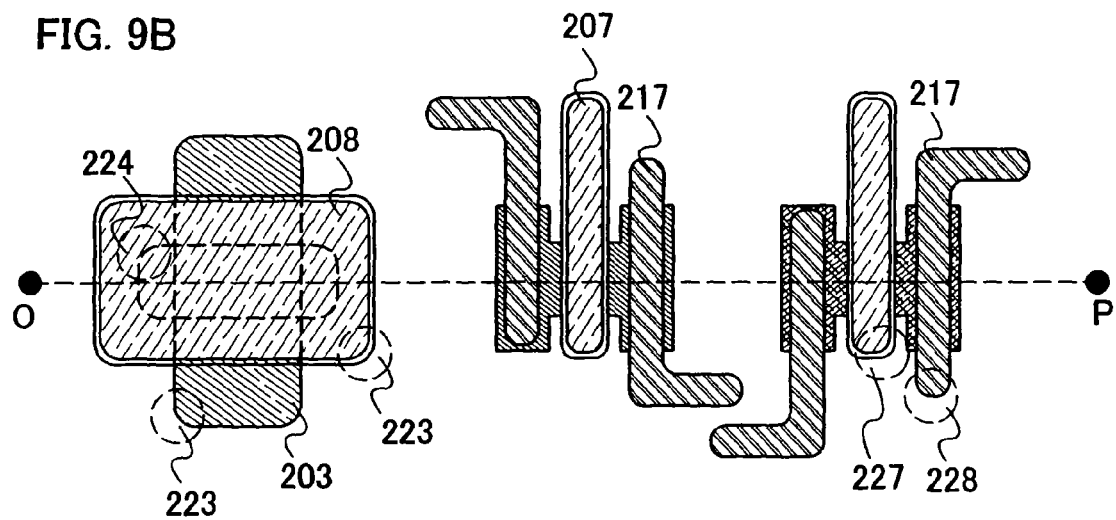

The first sacrifice layer 203 and the second sacrifice layer 208 can be formed to have a shape 223 whose corners are round when viewed from above (see FIG. 9B). Moreover, the structural layer 205 can be formed to have a shape 223 whose corners are round when viewed from above (see a top view of FIG. 9B). In this way, since the pattern of the sacrifice layer has round corners, generation and attachment of dust in the etching and washing steps and the like can be reduced.

The first sacrifice layer 203, the second sacrifice layer 208, and the structural layer 205 are thicker than other layers formed for manufacturing a semiconductor element. For example, in many cases, the semiconductor layer 204 has a thickness of about 60 nm while the sacrifice layers and structural layer have a thickness of about 1 µm. If these thick layers are patterned to have their corners with right angles or sharp angles or are provided so that the cross section thereof is perpendicular to the substrate, the corners are peeled to generate dust that contaminates a semiconductor device. If the thick layers have a T-shape or a box-shape, dust is trapped in the corners and such dust cannot be removed even in a washing step. Therefore, it is desirable that the sacrifice layer and the structural layer have shapes 223 and 224 whose corners are round when viewed from above and tapered shapes 225 and 226 when viewed from a cross section.

The aforementioned tapered shape and round shape are not limited to those of the sacrifice layers and structural layer that form the microstructure. In the case of forming the thick layers, it is desirable that the layers have shapes whose corners are round when viewed from above and tapered shapes when viewed from a cross section. For example, it is desirable that the gate electrode 207 and the wire 217, which are comparatively thick, have shapes 227 and 228 whose corners are round when viewed from above and tapered shapes when viewed from a cross section. As a result, generation of dust can be suppressed and yield can be improved.

This embodiment mode can be freely combined with the above embodiment mode.

EMBODIMENT MODE 6

In a microstructure provided in a semiconductor device of the present invention, a structural layer may have a single-layer or multilayer structure. This embodiment mode will describe a structural layer having a multilayer structure.

Figure 6A:
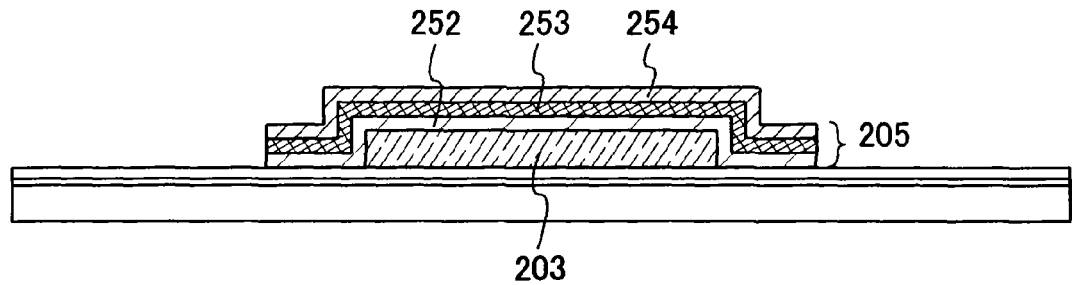
FIGS. 6A to 6D show semiconductor devices of the present invention.

FIG. 6A shows a case in which silicon layers having different conditions are stacked to form the structural layer 205. Over the first sacrifice layer 203 formed by the above step, a first silicon layer 252, a second silicon layer 253, and a third silicon layer 254 can be stacked to form the structural layer 205. The first silicon layer 252, the second silicon layer 253, and the third silicon layer 254 can be formed by arbitrarily stacking a layer having polycrystalline silicon, a layer having amorphous silicon, and a layer having silicide.

For example, the structural layer 205 can be formed in such a way that the first silicon layer 252 is formed by a layer having amorphous silicon, the second silicon layer 253 is formed by a layer having silicide, and the third silicon layer 254 is formed by a layer having polycrystalline silicon. In order to form this structural layer 205, the first silicon layer 252 is formed by a layer having amorphous silicon over the first sacrifice layer 203. Subsequently, the second silicon layer 253 is formed by forming a layer having amorphous silicon, applying a metal element for promoting crystallization, and carrying out crystallization by laser irradiation or the like. Then, the third silicon layer 254 is formed by forming a layer having amorphous silicon, applying a metal element for promoting crystallization, carrying out crystallization by laser irradiation or the like, and removing the metal element by a later-described gettering step.

By stacking a layer having amorphous silicon, a layer having silicide, and a layer having polycrystalline silicon in this way, the structural layer 205 having a conductive property, high strength, and a structure which is difficult to be broken can be formed.

Similarly, the first silicon layer 252 and the third silicon layer 254 can be formed by layers having polycrystalline silicon and the second silicon layer 253 can be formed by a layer having amorphous silicon. By having a structure in which amorphous silicon which is unlikely to cause plastic deformation is sandwiched between polycrystalline silicon having high toughness, the structural layer 205 having both of flexibility and hardness can be formed. Moreover, by forming the second silicon layer 253 by a layer having silicide, the structural layer 205 having a conductive property in addition to flexibility and hardness can be formed. Here, a combination of multilayer is not limited to the above example, and a layer having amorphous silicon, a layer having silicide, and a layer having polycrystalline silicon can be selectively stacked arbitrarily.

Figure 6B:
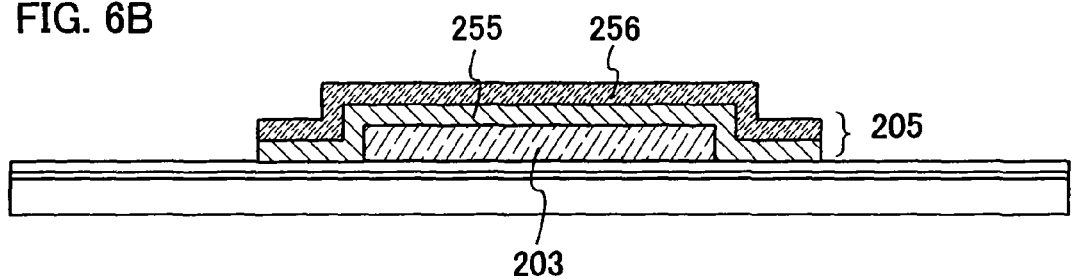

Although FIG. 6A shows an example in which the structural layer 205 has the three silicon layers, the present invention is not limited to the three layers. For example, the structural layer 205 can be formed with two silicon layers as shown in FIG. 6B. In other words, the structural layer 205 can be formed in a single-layer structure or a multilayer structure including two or more layers.

The structural layer 205 shown in FIG. 6B can be formed by stacking a first silicon layer 255 and a second silicon layer 256 over the first sacrifice layer 203. The first silicon layer 255 and the second silicon layer 256 can be formed by arbitrarily stacking a layer having polycrystalline silicon, a layer having amorphous silicon, and a layer having silicide.

If thickness is necessary in order to obtain the strength of the structural layer 205, the structural layer 205 can be formed to be thicker while having necessary characteristics, by stacking films as described above. For example, even in a layer which cannot be formed thick at one time because of large distribution difference in internal stress, the stress can be relaxed by repeating film formation and patterning.

Figure 6C:
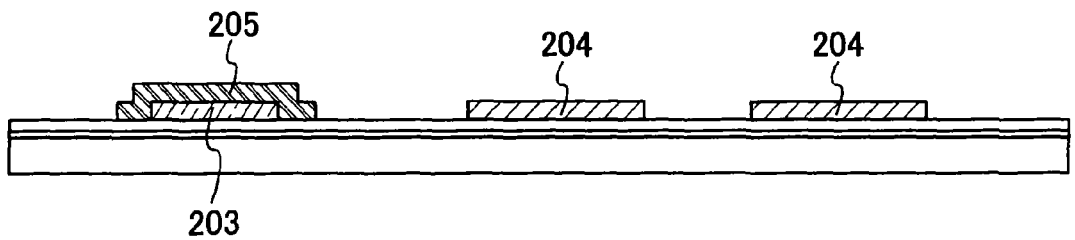

Moreover, it is considered that the semiconductor layer 204 that forms the semiconductor element and the structural layer 205 that forms the microstructure require very different characteristics. Moreover, the characteristics of the structural layer 205 to be required differ depending on a structure, an intended purpose, and the like of the microstructure. Therefore, as shown in FIG. 6C, the semiconductor layer 204 and the structural layer 205 can be formed by silicon layers having different conditions.

For example, the semiconductor layer 204 can be formed by a layer having polycrystalline silicon, and the structural layer 205 can be formed by a layer having amorphous silicon. In order to form the silicon layers separately, amorphous silicon is formed over a substrate, a metal element for promoting crystallization is applied only in a region where the layer having polycrystalline silicon is to be formed, and crystallization is carried out by irradiating with a laser only the region where the metal element is added, whereby the layer having polycrystalline silicon can be formed selectively.

By forming the semiconductor layer 204 with the use of a layer having polycrystalline silicon, a semiconductor element having high mobility and superior element characteristics can be manufactured. The layer having polycrystalline silicon has continuous crystal grain boundaries because the metal element for promoting crystallization is used for the crystallization; therefore, mobility and characteristics of this layer are superior to those of a layer having polycrystalline silicon crystallized without using the metal element. Moreover, by forming the structural layer 205 with the use of a layer having amorphous silicon, a microstructure having high strength to maintain a structure can be manufactured.

Even in the multilayer structure described with reference to FIGS. 6A and 6B, the semiconductor layer 204 and the structural layer 205 can be formed by different silicon layers. At this time, the multilayer structure of the semiconductor layer 204 and the structural layer 205 may be the same or different.

For example, the semiconductor layer 204 and the structural layer 205 can be formed by stacking a layer having amorphous silicon and a layer having polycrystalline silicon. The semiconductor layer 204 can be formed by stacking a layer having amorphous silicon and a layer having polycrystalline silicon, and the structural layer 205 can be formed by stacking a layer having amorphous silicon and a layer having silicide. In order to manufacture multilayer structures differently for the semiconductor layer and the structural layer in this way, an amorphous silicon layer is formed first. Then, polycrystalline silicon and amorphous silicon for forming silicide are formed, a metal element for promoting crystallization is applied, crystallization is carried out by laser irradiation or the like, and the metal element is removed from only a portion to become the semiconductor layer 204 by a gettering step.

By stacking the silicon layers to form the semiconductor layer 204 and the structural layer 205 in this way, the steps can be carried out easily to form the structural layer 205 thick. Moreover, by forming a layer having polycrystalline silicon as the semiconductor layer 204, such an advantage is obtained that the structural layer 205 can be formed thick without degrading semiconductor element characteristics.

Moreover, only one of the semiconductor layer 204 and the structural layer 205 may have a multilayer structure. For example, the semiconductor layer 204 is formed by a layer having polycrystalline silicon, which has high mobility, in order to have favorable semiconductor element characteristics, and the structural layer 205 is formed by arbitrarily stacking a layer having amorphous silicon, a layer having silicide, and a layer having polycrystalline silicon in order to obtain strength appropriate for the structural layer 205. On the contrary, the semiconductor layer 204 can have a multilayer structure while the structural layer 205 can have a single-layer structure.

Here, the multilayer structures of the semiconductor layer 204 and the structural layer 205 are not limited to those described above, and any combination is applicable. By using different multilayer structures for the structural layer 205 and the semiconductor layer 204, layers having characteristics suitable for forming a semiconductor element and a microstructure can be obtained.

Figure 6D:
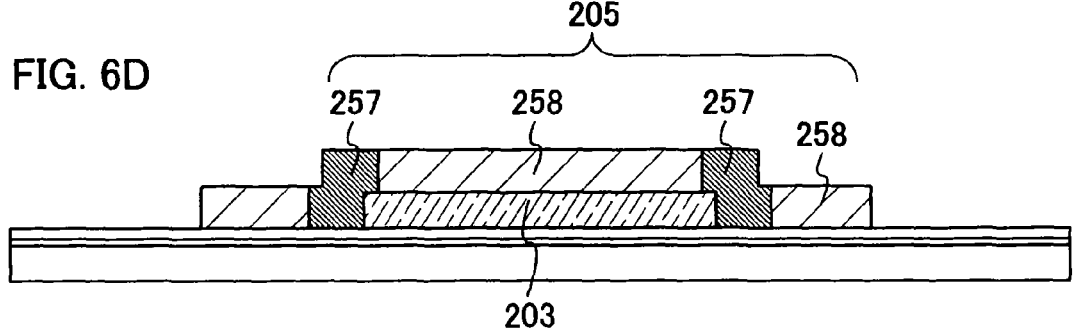

As shown in FIG. 6D, the silicon layer that forms the structural layer 205 can be separately manufactured in parts. FIG. 6D shows the structural layer 205 in which a first portion 257 and a second portion 258 are separately formed. The first portion 257 and the second portion 258 of the structural layer 205 can be formed by separately using a layer having polycrystalline silicon, a layer having amorphous silicon, and a layer having silicide arbitrarily.

For example, the first portion 257 of the structural layer can be formed by a layer having amorphous silicon, and the second portion 258 of the structural layer can be formed by a layer having polycrystalline silicon. In order to form the silicon layers in parts, crystallization may be carried out in such a way that amorphous silicon is formed over a substrate, a metal element for promoting crystallization is applied only to a portion where the layer having polycrystalline silicon is intended to be formed, and then the portion to which the metal element is added is crystallized by laser irradiation or the like. If the portions to be separately manufactured are minute, partial crystallization is possible by forming a resist mask over amorphous silicon by a photolithography method or the like. By changing a condition of a laser to be delivered to the amorphous silicon (for example, reducing irradiation intensity), only a part thereof (for example, a pillar portion of a brace structure) is not crystallized to remain amorphous while the other parts can be crystallized.

By separately manufacturing silicon layers in parts in this way, the structural layer 205 having a support pillar portion which is hard and a movable portion which is flexible can be formed.

Further, the structural layer 205 and the semiconductor layer 204 can be formed by combining the aforementioned methods so that the multilayer structure and the structure in which parts are separately manufactured are combined. For example, as shown in FIG. 6B, the structural layer 205 can be formed in a two-layer structure and a second silicon layer can be formed in parts: the first portion 257 and the second portion 258.

Further, as shown in FIG. 6D, the structural layer 205 can be manufactured in parts: the first portion 257 and the second portion 258, and one of the first portion 257 and the second portion 258 can be formed by stacking layers.

As described above, the semiconductor layer 204 and the structural layer 205 can be formed by stacking or separately forming silicon layers having different conditions. Since a semiconductor device of the present invention can have a multilayer structure or carry out separate formation with various combinations, not only the above combination but also any combination is applicable.

As in the above example, the semiconductor layer 204 that forms the semiconductor element and the structural layer 205 that forms the microstructure can be formed by stacking or separately forming in parts silicon layers having different characteristics. Thus, by separately forming the semiconductor layer 204 and the structural layer 205, layers having characteristics that are the most appropriate for the semiconductor element and the microstructure can be formed.

Such layer stacking and separate formation can be carried out by combining film formation, crystallization, gettering and so on for multiple times. In addition, selective application of a metal element that promotes crystallization, selective laser irradiation for crystallization, selective removal of the metal element by a gettering step, and so on can be conducted. In the case of applying the metal element selectively, a droplet discharging method typified by an ink jet method or selective formation of a mask can be employed.

By changing a condition of a laser for crystallization, layer stacking or separate formation can be carried out. For example, when amorphous silicon is crystallized by irradiating with a laser having reduced intensity, an upper part of the layer has polycrystalline silicon while a lower part thereof has amorphous silicon. If a layer having a thick portion and a thin portion like in a brace structure is crystallized by laser irradiation, the thin portion can be entirely crystallized while the thick portion can be crystallized only in its upper part and remains amorphous in its lower part.

For example, if polycrystalline silicon, which is superior in toughness, and amorphous silicon, which is unlikely to be plastic-deformed, are used in combination, a layer having both of strength and flexibility can be formed. Since the layer having polycrystalline silicon crystallized by the above step has continuous grain boundaries and covalent bonds are also continuous, stress concentration that is generated because of defects caused by unpaired bond between the grain boundaries does not occur. Accordingly, breaking stress is high. Therefore, even though breaking occurs from a crystal defect in the layer having amorphous silicon, the breaking is unlikely to spread to the layer having polycrystalline silicon; therefore, the breaking can be stopped.

Silicon alloy like nickel silicide has high strength and a conductive property. After amorphous silicon is crystallized by using a metal element for promoting crystallization to form a layer having polycrystalline silicon, the metal element is selectively left wholly or partially and a heat treatment is added thereto as necessary. By using in combination silicide having hardness and a conductive property and polycrystalline silicon superior in toughness, a layer having hardness, flexibility, and a conductive property can be formed.

In the case of laser crystallization using a metal element, silicon crystal growth progresses perpendicularly toward a substrate. Meanwhile, in the case of laser crystallization without using a metal element, silicon crystal growth progresses parallel to a substrate. These may be combined. For example, in the case of stacking these, even when breaking occurs in one layer, crack does not spread to a layer having a different crystal direction because crystal directions are different, so that the breaking is avoided. Thus, a layer having high strength in addition to flexibility unique to polycrystalline silicon can be formed.

As described above, the structural layer 205 having strength and electric characteristics in response to specification can be formed by stacking different silicon layers, changing the thickness ratio of silicon layers to be stacked, combining layer stacking and separate formation, and so on. Moreover, when the semiconductor layer 204 and the structural layer 205 are formed by layer stacking or separate formation, a layer having characteristics that are the most appropriate for the semiconductor element and the microstructure can be formed. Moreover, the aforementioned layer stacking and separate formation can be carried out easily. Thus, it becomes possible to easily form the semiconductor layer 204 and the structural layer 205 having desired characteristics.

This embodiment mode can be freely combined with the above embodiment mode.

EMBODIMENT MODE 7

Next, a method for manufacturing an antenna that forms a semiconductor device of the present invention will be described.

Figure 10A:
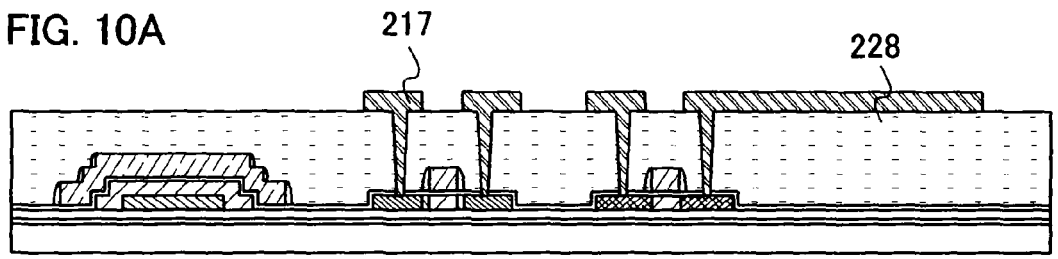
FIGS. 10A and 10D show manufacturing steps of a semiconductor device of the present invention.

First, as shown in FIG. 10A, the second conductive layer is formed and patterned to form the wire 217. At the same time, an antenna 229 can be formed. This step can be carried out prior to etching away the first sacrifice layer and the second sacrifice layer. By forming the wire 217 and the antenna 229 at the same time, the number of steps can be reduced.

Figure 10B:
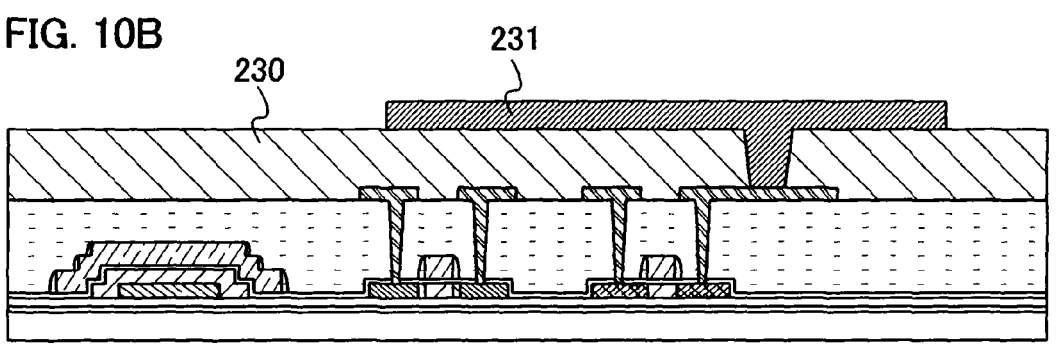

As shown in FIG. 10B, a third protective layer 230 can be formed over the wire 217 and the second insulating layer 228, and an antenna 231 can be formed thereover. In order to electrically connect the antenna 231 and the wire 217, a contact hole is formed in the third protective layer 230. This step is conducted prior to etching away the sacrifice layers. Then, at etching of the sacrifice layers, a second contact hole 218 is formed in the second insulating layer 228 and the third protective layer 230. Subsequently, etchant is introduced through the second contact hole 218 to etch away the sacrifice layers. This can be used when the wire 217 and the antenna 229 cannot be formed at the same time as shown in FIG. 10A, for example when the film thicknesses of the wire 217 and the antenna 229 are different, the antenna 229 occupies a large area, and so on.

Figure 10C:
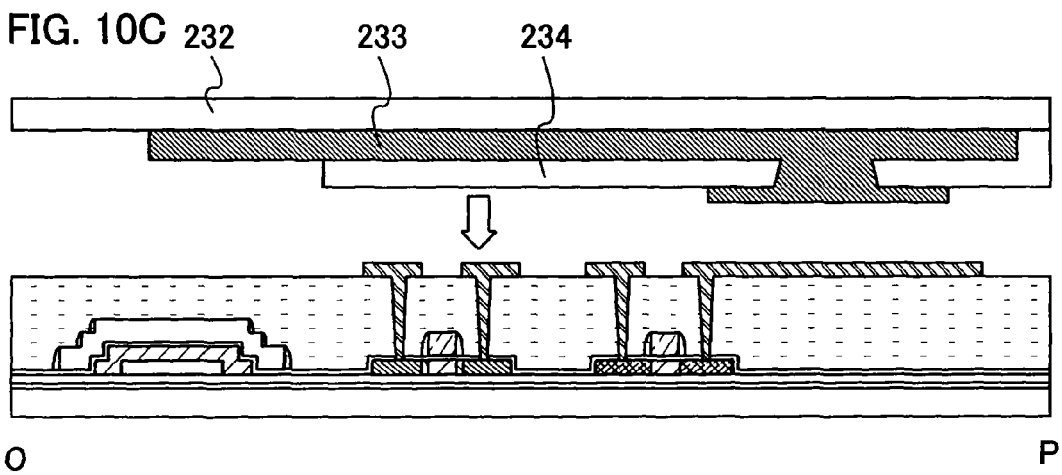

As shown in FIG. 10C, a counter substrate 232 can be provided to a semiconductor device and an antenna 233 can be formed over the counter substrate. At this time, it is also possible to provide a protective layer 234 in a part not facing a microstructure in order to prevent the microstructure from being pressed to be broken. This makes it possible to prevent the microstructure from being broken when the substrate 201 having an insulating surface and the counter substrate 232 are attached to each other. By using this method, the antenna 233 can be formed in a larger area than that shown in FIG. 10B. Since the antenna 233 is formed over the counter substrate 232, damage given to the semiconductor element and the microstructure can be reduced as compared with the case of forming an antenna over a substrate where a microstructure and a semiconductor element have been formed.

Figure 10D:
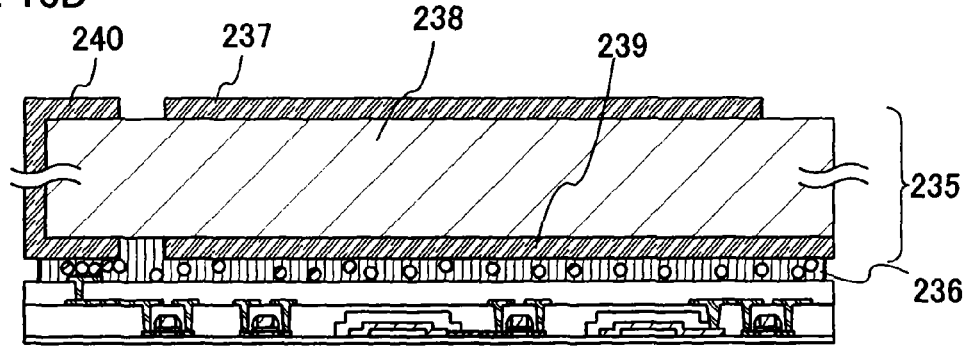

As shown in FIG. 10D, a ceramic antenna 235 (planar antenna) can be used as the antenna. The ceramic antenna 235 can be formed by a structure in which a first conductive layer 237 functioning as a reflector and a second conductive layer 239 functioning as a ground contact body have a dielectric layer 238 interposed therebetween. Power supply from the first conductive layer 237 to the layer having a microstructure and a semiconductor layer can be achieved by providing a power feeding layer 240. Moreover, a structure in which power is supplied by providing a power feeding point may be used. In FIG. 10D, the ceramic antenna 235 has a structure of providing the power feeding layer 240.

The ceramic antenna 235 can be manufactured on a surface of the dielectric layer 238 by forming the dielectric layer 238 with the use of ceramic or an organic resin having a high dielectric constant, a mixture thereof, a magnetic body, or the like, and forming conductive layers 237 and 239, and the power feeding layer 240 with a conductive material by a printing method, a plating method, or the like. Alternatively, the ceramic antenna 235 can be formed in such a way that conductive layers are formed over the entire surface of the dielectric layer 238 by an evaporation method, a sputtering method, or the like and the conductive layers can be etched into desired shapes.

The second conductive layer 239 and the power feeding layer 240 manufactured in this way are electrically connected to the layer having a microstructure and a semiconductor element. Specifically, the second conductive layer 239 is connected to the portion that gives a ground contact potential of the layer having the semiconductor element, and the power feeding layer 240 is connected to the wireless communication circuit described with reference to FIG. 1A.

Frequency bands of an electromagnetic wave to be used by a reader/writer and a semiconductor device for wireless communication are a long wave band up to 135 kHz, a short wave band from 6 to 60 MHz (typically 13.56 MHz), an ultrashort wave band of 400 to 950 MHz, a microwave band of 2 to 25 GHz, and so on. The antenna can be designed in accordance with frequency of an electromagnetic wave to be used for communication. The antenna can be separately provided in such a way that an antenna for communicating with a reader/writer and an antenna for supplying drive electric power are separated.

This embodiment mode can be freely combined with the above embodiment mode.

EMBODIMENT MODE 8

This embodiment mode will describe with reference to the drawings a method for manufacturing a microstructure and a semiconductor element over one substrate in order to manufacture a semiconductor device of the present invention, which is different from the method shown in Embodiment Mode 1. In the drawings, an upper side shows a top view while a lower side shows a cross-sectional view taken along a line O-P or Q-R in the top view.

A microstructure and a semiconductor element provided in a semiconductor device of the present invention can be manufactured over an insulating substrate.

Figure 11A:
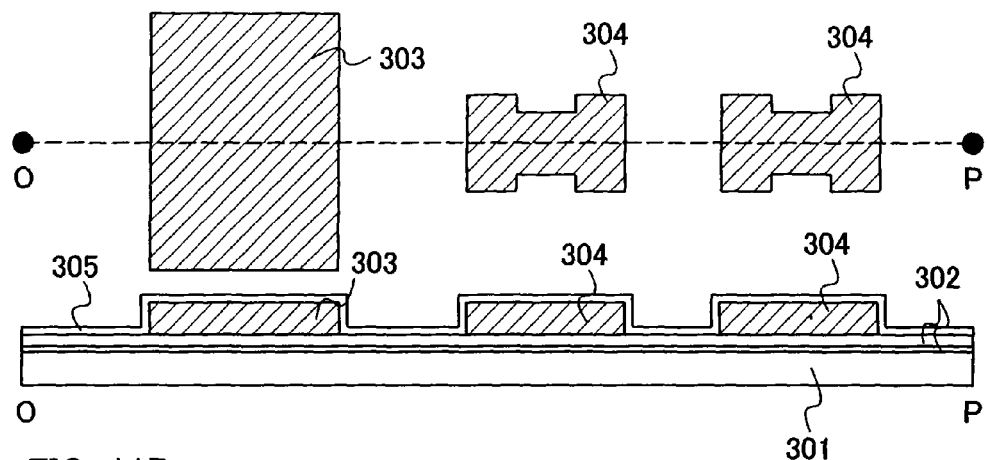
FIGS. 11A to 11C show manufacturing steps of a semiconductor device of the present invention.

First, a base film 302 is formed over a substrate 301 having an insulating surface (see FIG. 11A). The base film 302 can be formed in a single-layer or multilayer structure by an insulating layer such as a silicon oxide film, a silicon nitride film, or a silicon oxynitride film. Here, the base film 302 is formed in a two-layer structure similarly to Embodiment Mode 4; however, the base film 302 may have a structure of a single insulating layer or three or more insulating layers that are stacked.

Subsequently, a semiconductor layer 303 that forms a microstructure and a semiconductor layer 304 that forms a semiconductor element are formed and patterned into an arbitrary shape (see FIG. 11A). The semiconductor layers 303 and 304 can be formed with a similar material and can have a similar crystal structure to those used in Embodiment Mode 4. In this embodiment mode, a crystalline semiconductor layer is manufactured by a heat treatment using a metal element similarly to Embodiment Mode 4.

Since a semiconductor layer having a metal element used for crystallization is superior in a conductive property, the metal element can be selectively removed only from the semiconductor layer 304 that forms the semiconductor element while leaving the metal element in the semiconductor layer 303 that forms the microstructure. If the metal element included in the semiconductor layer 303 that forms the microstructure is removed, the semiconductor layer 303 that forms the microstructure can be used without adding the metal element thereto. If the semiconductor layer 303 needs a conductive property to drive the microstructure, an impurity imparting P-type or N-type conductivity can be added. This impurity addition can be carried out at the same time as a step of adding an impurity for forming an impurity region of the semiconductor element. The semiconductor layer 303 having a conductive property in this step is preferable for a structure of a microstructure which is controlled by electrostatic force.

Next, an insulating layer 305 is formed over the semiconductor layers 303 and 304 (see FIG. 11A). The insulating layer 305 can be formed with similar material and method to those shown in Embodiment Mode 4. The insulating layer 305 formed in a region of the semiconductor element can function as a gate insulating layer.

The insulating layer 305 can be formed by a high-density plasma treatment under a condition and the like similar to those of Embodiment Mode 4.

Although description has been made on a case of forming the insulating layer 305 by the high-density plasma treatment, the high-density plasma treatment may be carried out to the semiconductor layers 303 and 304. The surface of the semiconductor layer can be modified by a high-density plasma treatment. Accordingly, a condition of the interface can be modified, whereby electrical characteristics of the semiconductor element and the microstructure can be improved. Moreover, a high-density plasma treatment can be applied to form not only the insulating layer 305 but also the base film 302 or another insulating layer.

Figure 11B:
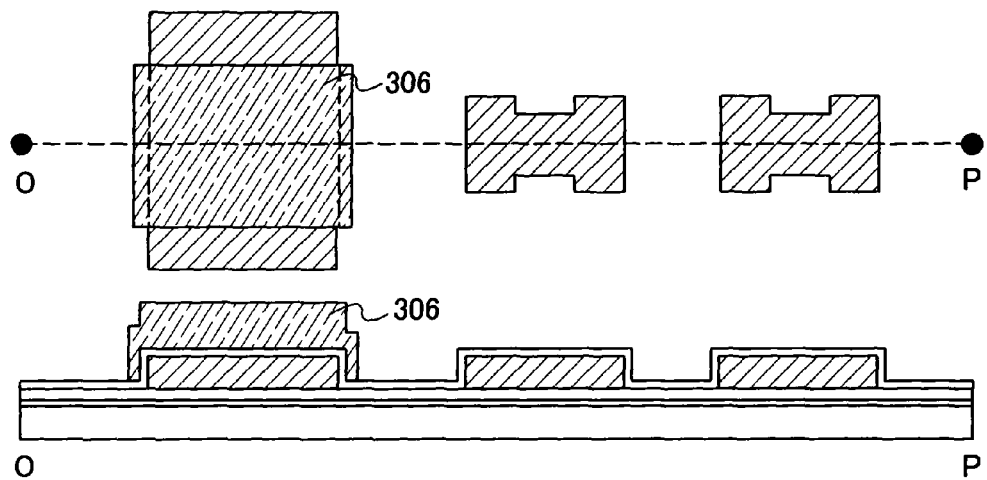

Subsequently, a first sacrifice layer 306 is formed over the semiconductor layer 303 that forms the microstructure and patterned into an arbitrary shape (see FIG. 11B). The first sacrifice layer 306 can be formed with a metal element, an element such as silicon, or a compound, for example tungsten or silicon nitride, by a sputtering method, a CVD method, or the like. The patterning is carried out by forming a resist mask formed by a photolithography method and carrying out anisotropic dry etching.

The thickness of the first sacrifice layer 306 is determined in consideration of various factors such as a material of the first sacrifice layer 306, structure and operation method of the microstructure, and a method of etching the sacrifice layer. For example, if the first sacrifice layer 306 is too thin, etchant does not diffuse so that etching is not conducted, or the structural layer is buckled after the etching. Moreover, if the first sacrifice layer is too thick in the case of operating the microstructure by electrostatic force, the microstructure cannot be driven. For example, in the case where the microstructure is driven by electrostatic force between the structural layer and the conductive layer in a lower part of the sacrifice layer, the first sacrifice layer 306 preferably has a thickness of 0.5 to 3 µm, more preferably 1 to 2.5 µm.

Figure 11C:
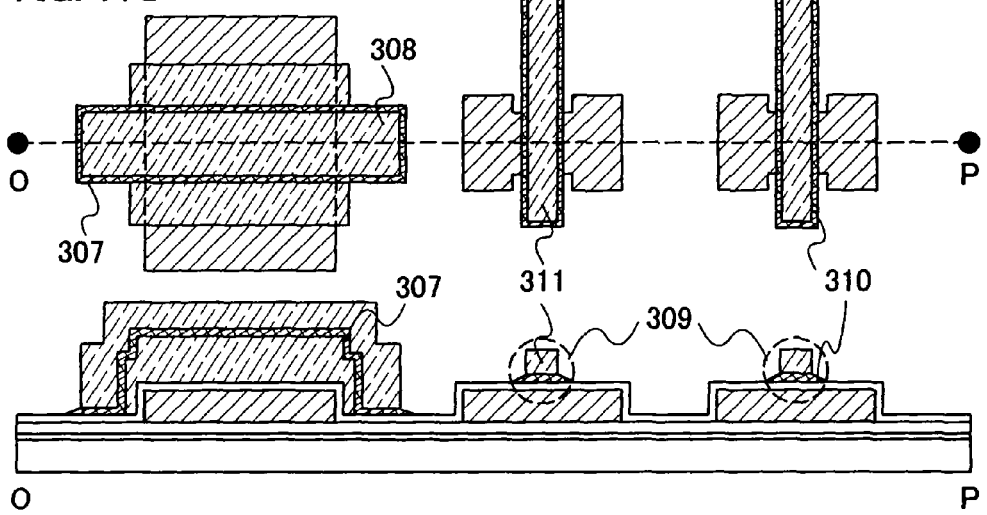

Next, conductive layers to become a structural layer 307, a second sacrifice layer 308 of the microstructure, and a gate electrode 309 of the semiconductor element are formed and patterned into an arbitrary shape (see FIG. 11C). The conductive layers can be formed with a metal element having a conductive property such as tungsten, a compound, or the like and can be formed sequentially by a sputtering method, a CVD method, or the like. In this embodiment mode, a structure in which conductive layers are stacked is employed. The stacked conductive layers may be formed with the same or different materials.

A first conductive layer 310 that forms the structural layer 307 of the microstructure and the gate electrode 309 of the semiconductor element is formed. The first conductive layer 310 may be formed with an element selected from Ta, W, Ti, Mo, Al, and Cu or an alloy or compound material containing the element as its main component in thickness of about 50 nm to 2 µm. Over the first conductive layer 310, a second conductive layer 311 that forms the second sacrifice layer 308 and the gate electrode 309 of the semiconductor element is formed. The second conductive layer 311 may be formed with an element selected from Ta, W, Ti, Mo, Al, and Cu, or an alloy or compound material containing the element as its main component in thickness of about 100 nm to 2 µm. As the first conductive layer and the second conductive layer, a semiconductor layer typified by a polycrystalline silicon film doped with an impurity element such as phosphorus or AgPdCu alloy may be used.

The conductive layers may have not only a two-layer structure but also a three-layer structure. For example, tungsten, tungsten nitride, or the like may be used for a first layer and alloy of aluminum and silicon (Al—Si) or alloy of aluminum and titanium (Al—Ti) may be used for a second layer, a titanium nitride film, a titanium film, or the like may be used for a third layer. Thus, these layers may be stacked to form a three-layer structure. In this case, the first layer and the second layer can function as the structural layer of the microstructure and the third layer can function as the second sacrifice layer. Alternatively, the first layer can function as the structural layer and the second layer and the third layer can function as the sacrifice layer. The conductive layer may have a single-layer structure.

After that, patterning is carried out with the following procedure, thereby forming the structural layer 307, the second sacrifice layer 308, and the gate electrode 309. First, a resist mask is formed to have a shape into which etching will be conducted. Subsequently, an ICP (Inductively Coupled Plasma) etching method is applied to etch the second sacrifice layer 308 and the second conductive layer 311. At this time, a cross section may be perpendicularly patterned or etched into a tapered shape by anisotropic etching. Next, etching conditions such as electric power to be applied to a coil-shaped electrode, electric power to be applied to an electrode on a substrate side, and electrode temperature on a substrate side are determined, under which the structural layer 307 and the first conductive layer 310 are etched into desired tapered shapes. As etching gas, chlorine-based gas such as $Cl_2$, $BCl_3$, $SiCl_4$, or $CCl_4$; fluorine-based gas such as $CF_4$, $SF_6$, or $NF_3$; or $O_2$ can be used.

It is preferable that the second sacrifice layer 308 and the first sacrifice layer 306 be etched at the same time when the sacrifice layers are etched to manufacture the microstructure, because the number of steps is fewer. Thus, it is desirable that the second sacrifice layer 308 be formed with the same material as the first sacrifice layer 306. However, the present invention is not limited to these materials, and the first sacrifice layer 306 and the second sacrifice layer 308 may be manufactured with the same material or different materials.

Next, an N-type impurity region and a P-type impurity region are formed by adding an impurity element to the semiconductor layer 304 that forms the semiconductor elements. Such impurity regions can be formed selectively by forming a resist mask by a photolithography method and carrying out a doping process for adding an impurity element. As a method for adding an impurity element, an ion doping method or an ion implantation method can be used. As the impurity element imparting N-type conductivity, typically phosphorus (P) or arsenic (As) is used. As the impurity element imparting P-type conductivity, typically boron (B) can be used. It is desirable that the N-type impurity region and the P-type impurity region have an impurity element imparting N-type conductivity added in a concentration range of $1 \times 10^{20}$ to $1 \times 10^{21}/cm^3$. By repeating etching and doping to the gate electrode 309 alternately as necessary, a high-concentration impurity region and a low-concentration impurity region can be formed while controlling the impurity concentration of the semiconductor layer.

Further, in the case where the gate electrode 309 is formed with a single conductive layer or the conductive layer having a multilayer structure is not etched into a tapered shape, an insulating layer in contact with a side surface of the gate electrode 309 (sidewall) can be formed by forming an insulating layer over the gate electrode 309 and anisotropically etching the insulating layer. The sidewall can be manufactured similarly to Embodiment Mode 4.

After forming the impurity regions, a heat treatment, infrared light irradiation, or laser irradiation for activating an impurity element is preferably carried out. The activation can be conducted by a similar means to that in Embodiment Mode 4.

After forming a passivation film which includes an insulating layer such as a silicon oxynitride film or a silicon oxide film, a heat treatment, infrared light irradiation, or laser irradiation may be conducted for hydrogenation. The hydrogenation can be carried out similarly to Embodiment Mode 4.

Figure 12A:
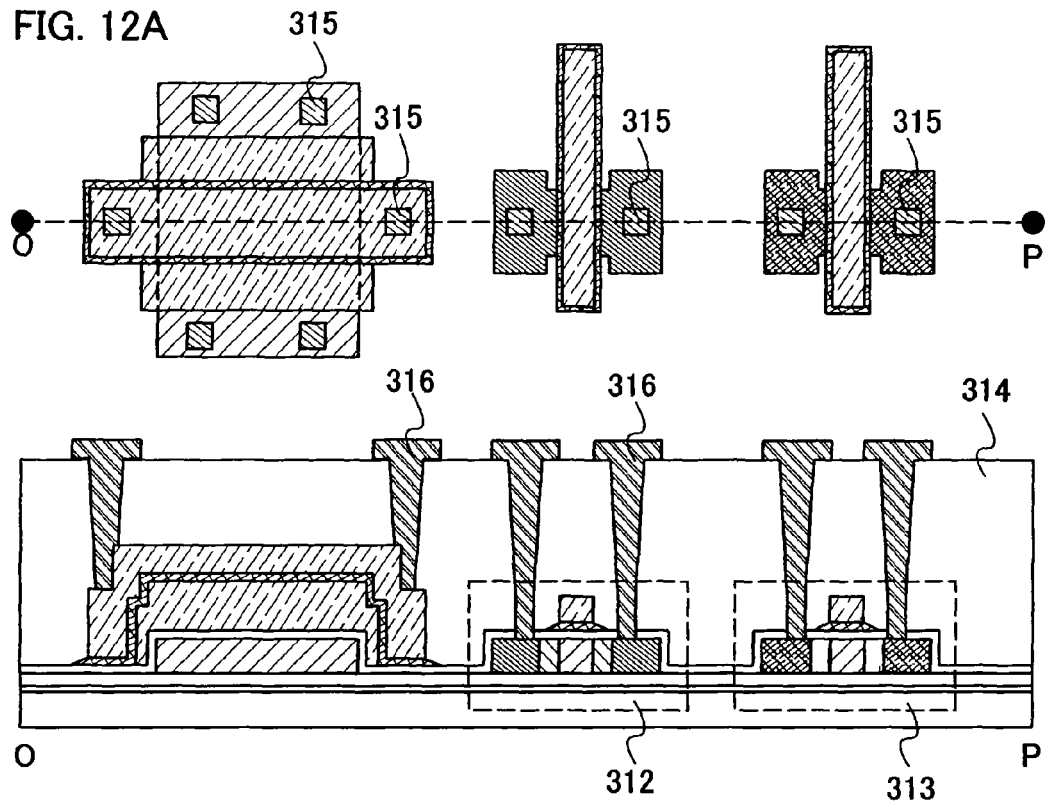
FIGS. 12A and 12B show manufacturing steps of a semiconductor device of the present invention.

By the above step, the N-type semiconductor element 312 and the P-type semiconductor element 313 are formed (see FIG. 12A). At this time, an impurity region is formed in a region of the semiconductor layer 303 that forms the microstructure which is not covered with the first sacrifice layer 306, the structural layer 307, and the second sacrifice layer 308.

Subsequently, an insulating layer 314 is formed so as to cover the whole (see FIG. 12A). The insulating layer 314 can be formed with an inorganic or organic material having an insulating property, or the like. The insulating layer 314 can be manufactured similarly to the insulating layer 215 shown in Embodiment Mode 4.

Next, the insulating layer 314 and the insulating layer 305 are sequentially etched to form a first contact hole 315 for connecting wires to the semiconductor layers 303 and 304 and the structural layer 307 (see FIG. 12A). As the etching process, a dry etching method or a wet etching method can be employed. In this embodiment mode, the first contact hole 315 is formed by dry etching.

Next, the first contact hole 315 is filled and a wire 316 is formed over the insulating layer 314 and patterned into an arbitrary shape, whereby wiring and the like that form a source electrode, a drain electrode, and an electric circuit are formed (see FIG. 12A). The wire 316 can be formed using a film including aluminum (Al), titanium (Ti), molybdenum (Mo), tungsten (W), or silicon (Si), or an alloy film including the element.

If the wire 316 is patterned to have a corner, the corner is preferably round like in Embodiment Mode 5.

Figure 12B:
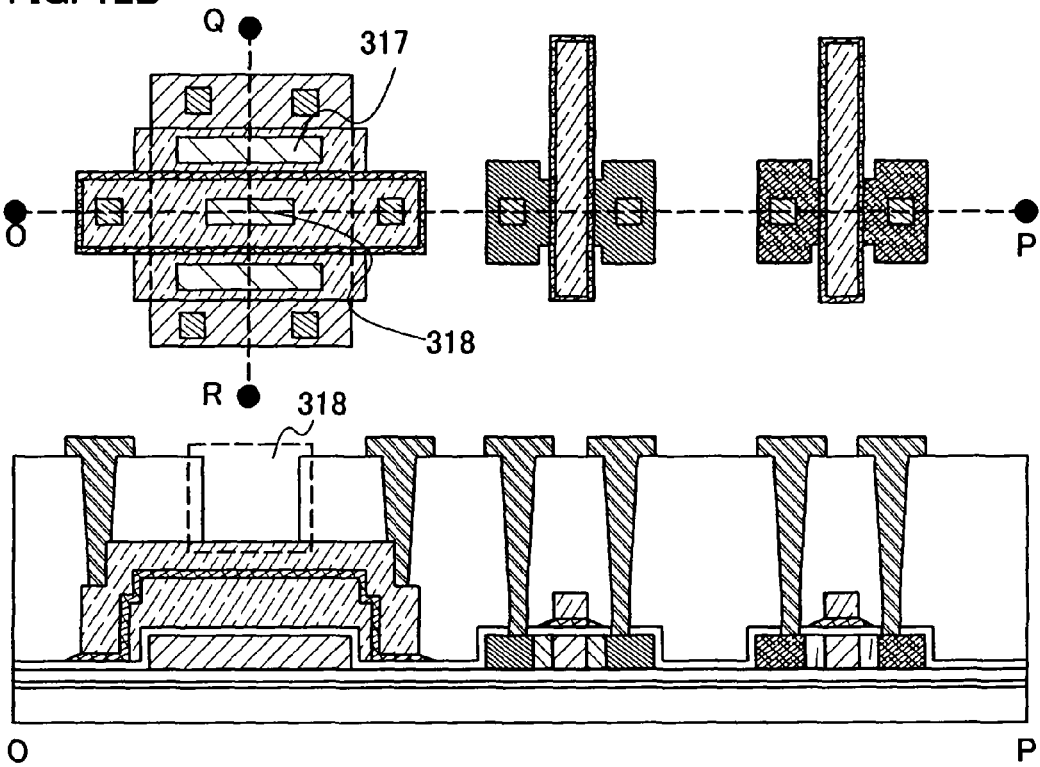

Next, the insulating layer 314 and the insulating layer 305 are sequentially etched, thereby forming second contact holes 317 and 318. The second contact hole 317 is formed to expose the first sacrifice layer 306 while the second contact hole 318 is formed to expose the second sacrifice layer 308 (see FIG. 12B). The etching process can employ a dry etching method or a wet etching method.

In this embodiment mode, the second contact holes 317 and 318 are formed by dry etching. The second contact holes 317 and 318 are opened to etch away the first sacrifice layer 306 and the second sacrifice layer 308. For example, it is preferable that the second contact holes 317 and 318 each have a diameter of 2 μm or more. In consideration of volume and the like of the sacrifice layers to be etched, the diameter of the contact hole is determined.

Moreover, the second contact holes 317 and 318 may be formed as contact holes having such diameter that the first sacrifice layer 306 and the second sacrifice layer 308 are easily etched. In other words, it is not necessary to form the small holes as mentioned above, and the second contact holes 317 and 318 may be formed so as to expose the entire sacrifice layer while leaving necessary portions of the insulating layer 314 over the semiconductor layers 303 and 304 and the like. Accordingly, time required for removing the sacrifice layers can be shortened.

Figure 13A:
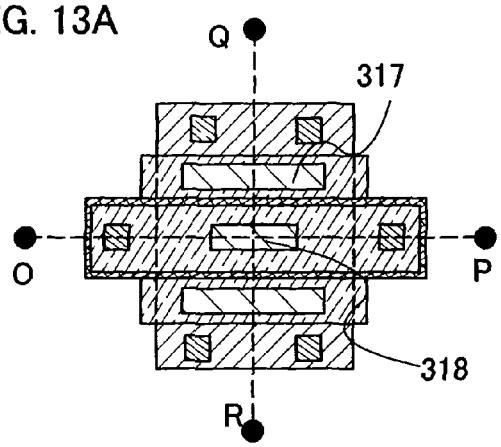
FIGS. 13A to 13E show semiconductor devices of the present invention.
Figure 13B:
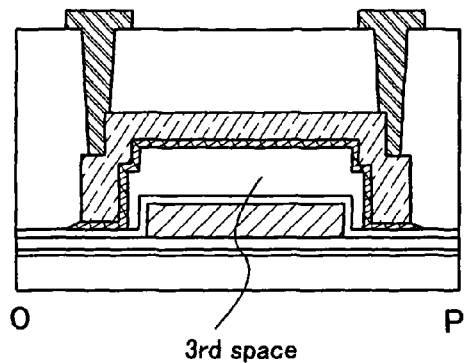
Figure 13C:
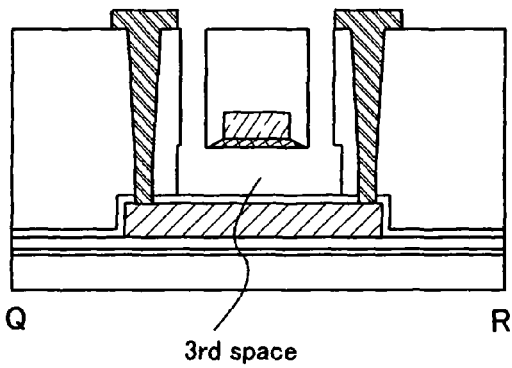

Next, the first sacrifice layer 306 and the second sacrifice layer 308 are etched away (see FIGS. 13A to 13C). Here, FIGS. 13A to 13C show only a microstructure. As the etching, a wet etching or dry etching method can be employed, whichever is appropriate for materials of the sacrifice layers. Thus, the sacrifice layers can be etched away through the second contact holes 317 and 318. Since the first sacrifice layer 306 and the second sacrifice layer 308 are connected to each other, both of them can be etched away through the second contact holes 317 and 318.

For example, if the first sacrifice layer 306 or the second sacrifice layer 308 is formed with tungsten (W), the etching is carried out by soaking the first sacrifice layer 306 or the second sacrifice layer 308 in a solution in which 28% of ammonia and 31% of hydrogen peroxide water are mixed with a ratio of 1:2 for about 20 minutes. If the first sacrifice layer 306 or the second sacrifice layer 308 is silicon dioxide, buffered fluorinated acid in which a water solution containing 49% of fluorinated acid and ammonium fluoride are mixed with a ratio of 1:7. If the first sacrifice layer 306 or the second sacrifice layer 308 is formed with silicon, phosphoric acid; hydride of alkali metal such as KOH, NaOH, or CsOH; $NH_4OH$; hydrazine; EPD (a mixture of ethylene diamine, pyrocatechol, and water); TMAH; IPA; an $NMD_3$ solution; or the like can be used.

In order to prevent buckle of the microstructure due to capillarity at drying after wet etching, rinse is carried out using an organic solvent with low viscosity (such as cyclohexane) or drying is carried out at low temperature and low pressure. Alternatively, these may be combined.

The first sacrifice layer 306 or the second sacrifice layer 308 can be removed by dry etching with the use of $F_2$ or $XeF_2$ under atmospheric pressure or high pressure.

In this way, a region where the first sacrifice layer is removed becomes a space (corresponding to the third space) and a region where the second sacrifice layer is removed becomes a space (corresponding to the fourth space).

In order to prevent buckle of the microstructure due to capillarity generated in these spaces after the removal of the first sacrifice layer 306 or the second sacrifice layer 308, a plasma treatment can be carried out to make the microstructure have a water-repellent property on the surface. By etching away the first sacrifice layer 306 and the second sacrifice layer 308 by this step, spaces are formed and a microstructure 319 having a movable portion can be manufactured.

In the aforementioned method for manufacturing the microstructure 319, it is necessary to select a suitable combination of a material for the structural layer 307, materials for the first sacrifice layer 306 and the second sacrifice layer 308, and etchant for removing the sacrifice layers. For example, in the case where a particular etchant is selected, the first sacrifice layer 306 and the second sacrifice layer 308 are preferably formed by using a material having higher etching rate than the structural layer 307.

Furthermore, in the case where the first sacrifice layer 306 and the second sacrifice layer 308 are formed with different materials and cannot be etched away by the same etchant, the sacrifice layers are etched in two separate steps. In this case, it is necessary to carefully consider a selective ratio between the sacrifice layers and a layer which is in contact with the etchant but which is not to be removed (for example, the structural layer 307, the insulating layer 314, and the like).

As shown in this embodiment mode, by manufacturing the structural layer of the microstructure with the conductive layer that forms the gate electrode, the microstructure having a movable portion, which has high strength and flexibility, can be manufactured.

Figure 13D:
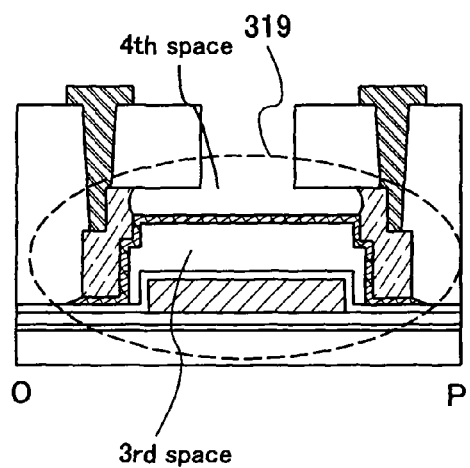
Figure 13E:
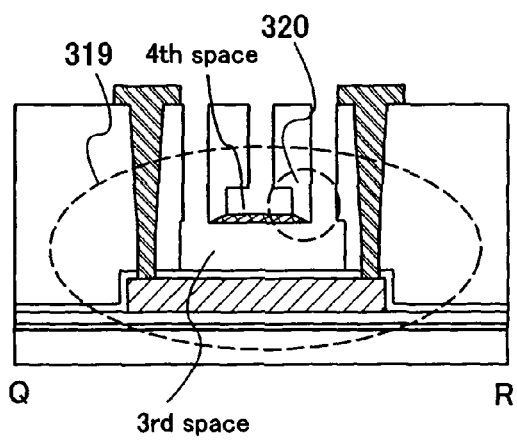

In the above step, the second sacrifice layer 308 is etched away and the conductive layer that forms the second conductive layer 311 is the structural layer 307; however, it is possible to manufacture the microstructure without etching away the second sacrifice layer 308 (see FIGS. 13D and 13E). In this case, only the first sacrifice layer 306 may be etched away, and the second contact hole 318 used for etching away the second sacrifice layer 308 is not necessary.

In particular, as shown in FIG. 13E, if the structural layer 307 and the second sacrifice layer 308 are formed and the sacrifice layer is etched away, in some cases, the insulating layer 314 remains attached to the tapered portion of the structural layer 307. This can be used as a temporal supporter to prevent the structural layer 307 from buckling when forming the microstructure 319 by etching away the sacrifice layers.

In the case of conducting wet etching to etch away the sacrifice layers, etchant penetrates in between the structural layer 307 and the insulating layer 305 to make the structural layer 307 and the insulating layer 305 attach to each other by capillary (i.e., buckle). In order to avoid this, the supporter can be manufactured by the insulating layer 314.

An area where a tapered portion of the structural layer 307 and the insulating layer 314 are attached to each other ranges from about 100 nm$^2$ to 1 µm$^2$, and the aforementioned attachment can be prevented by the supporter of the insulating layer 314. However, when the structural layer 307 is used by being moved, the supporter is not necessary. Here, when a charge having different polarity is given between the structural layer 307 and the semiconductor layer 303 of the microstructure 319, i.e., voltage is applied therebetween, the structural layer 307 is drawn to the semiconductor layer 303 side by electrostatic force to bend downward, whereby the supporter and the structural layer 307 can be separated from each other. This is because the supporter and the structural layer 307 are attached to each other in a small area with a size of about 100 nm$^2$ to 1 µm$^2$.

By manufacturing the microstructure 319 by using the supporter in this way, it is possible to prevent the structural layer 307 from buckling.

This embodiment mode can be freely combined with the above embodiment mode.

EMBODIMENT MODE 9

A microstructure and a semiconductor element having various structures can be manufactured by partially changing the steps described in the above embodiment mode or adding another step. Therefore, this embodiment mode will describe different steps from the above embodiment mode.

Figure 14A:
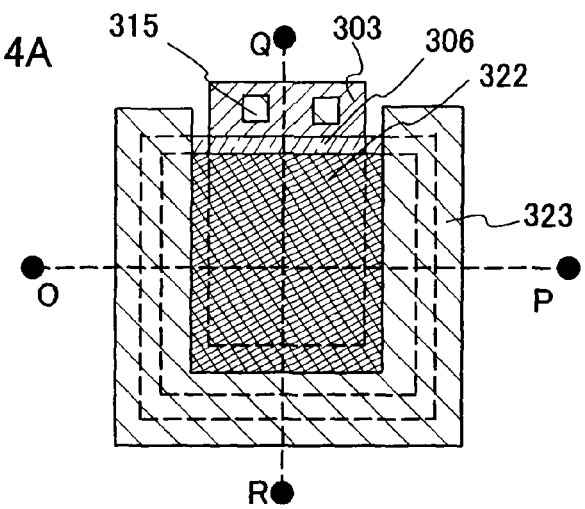
FIGS. 14A to 14E show semiconductor devices of the present invention.
Figure 14B:
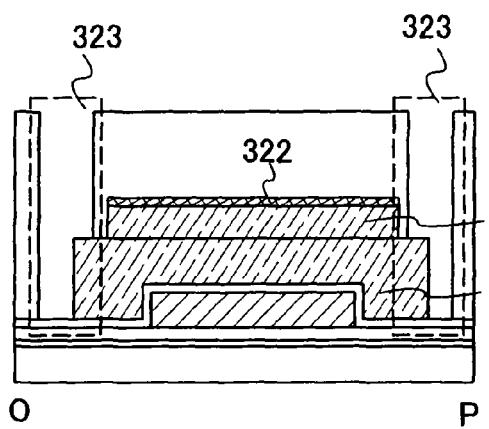
Figure 14C:
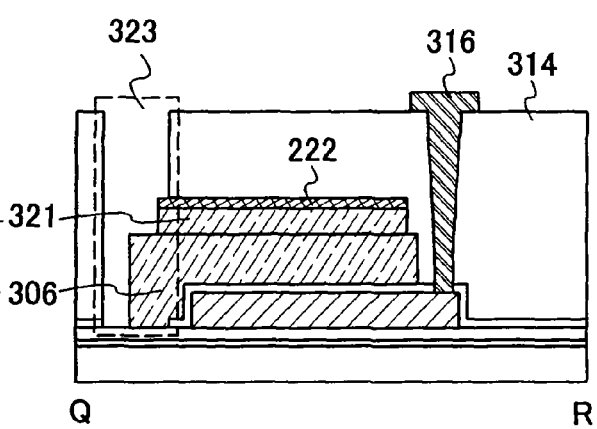
Figure 14D:
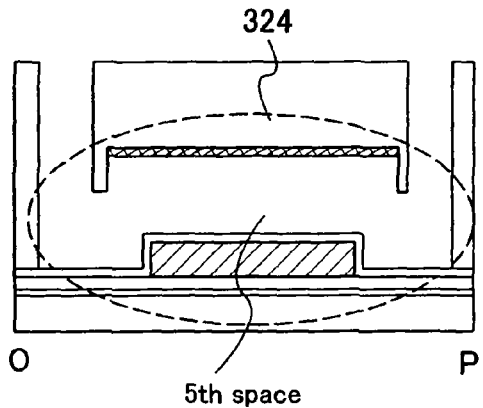
Figure 14E:
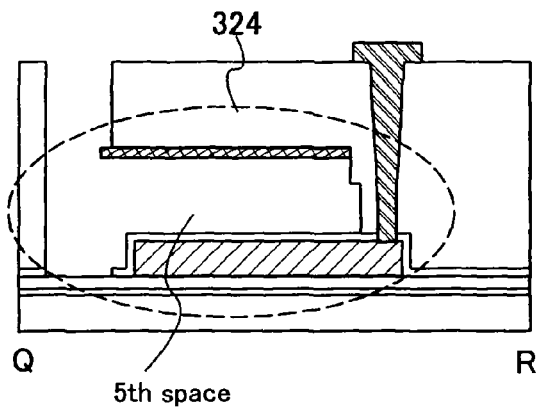

Over the first sacrifice layer 306, a second sacrifice layer 321 can be formed with the same material as the first sacrifice layer 306 and then a conductive layer 322 can be stacked sequentially (see FIGS. 14A to 14C). Then, spaces are formed by etching away the first sacrifice layer 306 and the second sacrifice layer 321 and a microstructure in which the conductive layer 322 and the insulating layer 314 function as structural layers can be manufactured. According to the above method, a microstructure 324 having a function of a capacitor, a cantilever, a switch, or the like with a space below can be manufactured (see FIGS. 14D and 14E).

At this time, a contact hole 323 for etching the sacrifice layers can be formed at the same time as forming the first contact hole 315. Moreover, the contact hole 323 may be formed after forming the wire 316. A shape of the structural layer that forms a structure can be determined by a shape of the contact hole 323.

Although the first sacrifice layer 306 and the second sacrifice layer 321 are stacked in the above example, a sacrifice layer with a single-layer structure can be formed without forming the first sacrifice layer 306. Moreover, although the first sacrifice layer 306 and the second sacrifice layer 321 are formed with the same material and etched away at the same time in the above example, the present invention is not limited to this example. For instance, the first sacrifice layer 306 and the second sacrifice layer 321 may be formed with different materials and etched away in multiple steps.

This embodiment mode can be freely combined with the above embodiment mode.

EMBODIMENT MODE 10

In order to protect the microstructure, a counter substrate can be pasted to the substrate. This embodiment mode will describe a mode in which a counter substrate is pasted to the substrate.

Figure 15A:
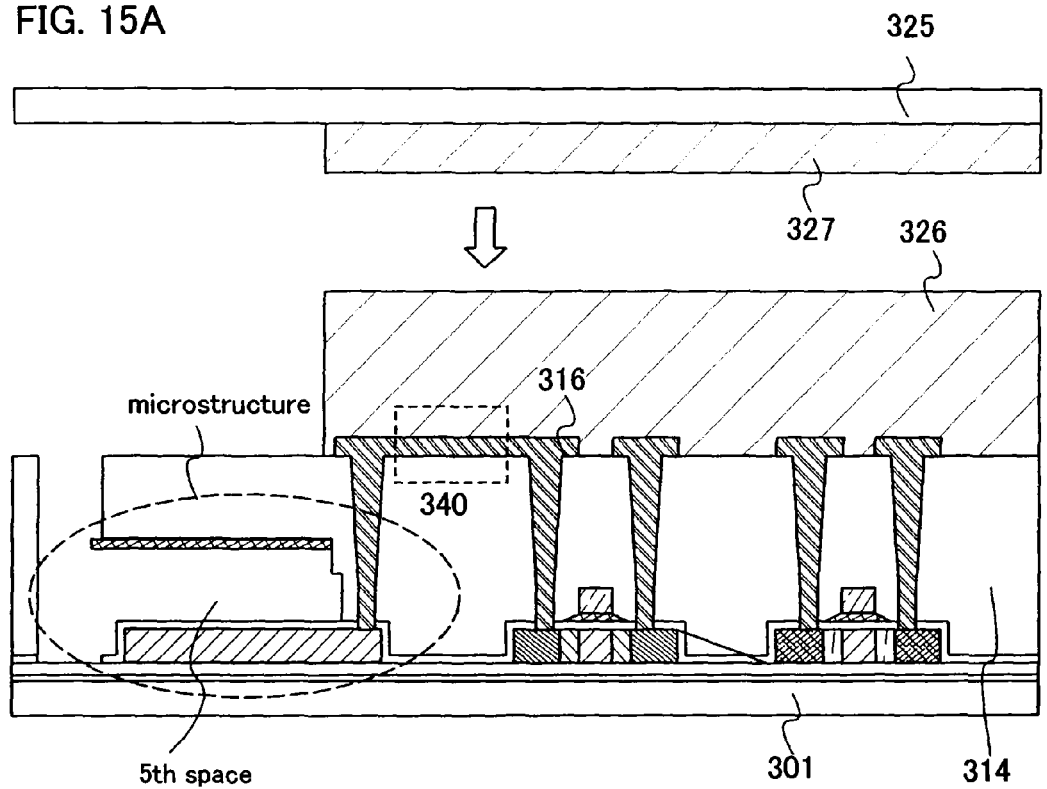
FIGS. 15A and 15B show manufacturing steps of a semiconductor device of the present invention.
Figure 15B:
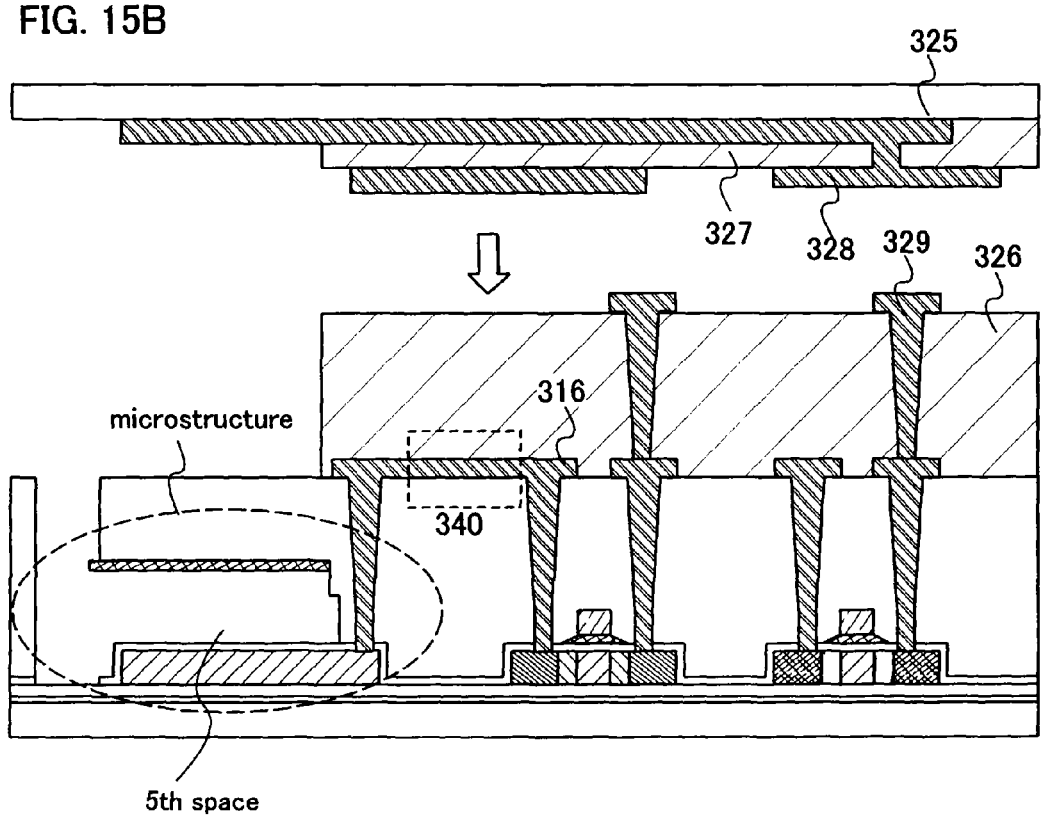

As shown in FIGS. 15A and 15B, a counter substrate 325 is pasted to the substrate 301 in order to protect the microstructure. In the case of pasting the counter substrate 325, after forming the wire 316, a second insulating layer 326 is formed over the insulating layer 314 (corresponding to a first insulating layer) and etched into an arbitrary shape. At this time, the second insulating layer 326 is patterned so as to expose the sacrifice layers and the structural layer that forms the microstructure. After that, the sacrifice layers are etched away, thereby manufacturing the microstructure having a space. A space shown in FIG. 15A has a region opened at one end.

Subsequently, the counter substrate 325 is described. A third insulating layer 327 is formed at a portion of the counter substrate 325 that faces to the second insulating layer 326 formed over the insulating layer 314 (corresponding to the first insulating layer) so that the microstructure is not broken because of pasting the counter substrate 325 (see FIG. 15A). Since the insulating layer is not formed in a portion facing the microstructure formed over the substrate 301, a space is formed between the substrates. Such a structure is preferable because the microstructure is not broken when pasting the substrate 301 and the counter substrate 325 to each other.

At the counter substrate 325, an antenna 328 that forms a circuit of a semiconductor device can be formed (see FIG. 15B). In this case, a second wire 329 to be connected to the wire 316 (corresponding to a first wire) is formed over the second insulating layer 326 which is formed over the insulating layer 314 (corresponding to the first insulating layer). Then, the substrate 301 and the counter substrate 325 are fixed and pasted to each other so that the second wire 329 is electrically connected to the antenna 328.

The substrate 301 and the counter substrate 325 are pasted to each other by preferably using an anisotropic conductive material so as to electrically connect the second wire 329 formed over the substrate and the antenna 328 formed at the counter substrate. The anisotropic conductive material has a conductive property only in a particular direction (here a direction perpendicular to the substrate), and for example, a thermally-cured anisotropic conductive paste (ACP) or thermally-cured anisotropic conductive film (ACF) can be used. The anisotropic conductive paste is called a binder layer and has a structure in which particles each having a conductive surface (hereinafter referred to as conductive particles) are diffused in a layer containing an adhesive as its main component. The anisotropic conductive film has a structure in which particles each having a conductive surface (hereinafter referred to as conductive particles) are diffused in a thermo-setting or thermoplastic resin film. As the particle having a conductive surface, a spherical resin plated with nickel (Ni), gold (Au), or the like is used. In order to prevent electric shorting between the conductive particles in unnecessary portions, an insulating particle made of silica or the like may be mixed therein. In addition, in the case where only the insulating layer is formed at the counter substrate 325 and electric connection such as antennas is not necessary, the substrate 301 and the counter substrate 325 can be pasted to each other by using an adhesive not having a conductive property.

At this time, similarly to the aforementioned step, in order to protect the microstructure formed over the substrate 301, it is desirable that the third insulating layer 327 be formed and the counter substrate 325 do not come into contact with the microstructure, in a portion not facing the microstructure and a connection portion of the second conductive layer and the third conductive layer. The antenna 328 may be formed only over the third insulating layer 327, or the antenna 328 may be formed over and under the third insulating layer 327 and the antenna 328 and the third insulating layer 327 may be connected to each other electrically (see FIG. 15B).

This embodiment mode can be freely combined with the above embodiment mode.

EMBODIMENT MODE 11

This embodiment mode will describe a manufacturing step of peeling the semiconductor device manufactured in accordance with the above steps from the substrate 301 and pasting the peeled device to another substrate or object. For example, a semiconductor device is manufactured over a glass substrate and then the semiconductor device can be transferred to a flexible substrate such as a plastic substrate which is thinner and softer than a glass substrate.

Figure 16A:
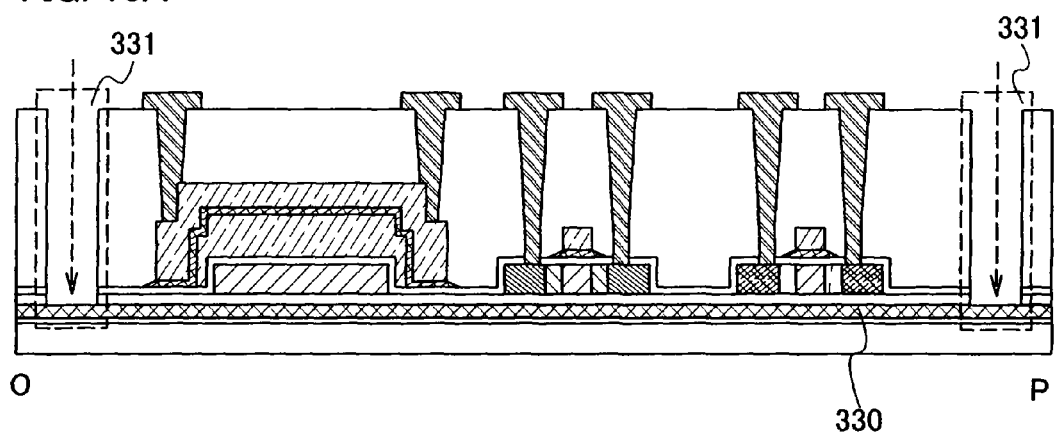
FIGS. 16A to 16C show manufacturing steps of a semiconductor device of the present invention.

In the case of peeling the semiconductor device from the substrate 301, a peeling layer 330 is formed when manufacturing the base film 302 (see FIG. 16A). The peeling layer 330 can be formed below the base film or between the stacked base films. Then, a contact hole 331 is formed to be exposed the peeling layer after forming the wire 316 in the above Embodiment mode. It is preferable that the semiconductor device is peeled from the substrate before forming the contact holes for etching the sacrifice layers. Because, if the semiconductor device is peeled from the substrate after forming the second contact holes for etching the sacrifice layers, peeling the semiconductor device from the substrate after manufacturing spaces by etching away the sacrifice layer may cause the space to break.

Figure 16B:
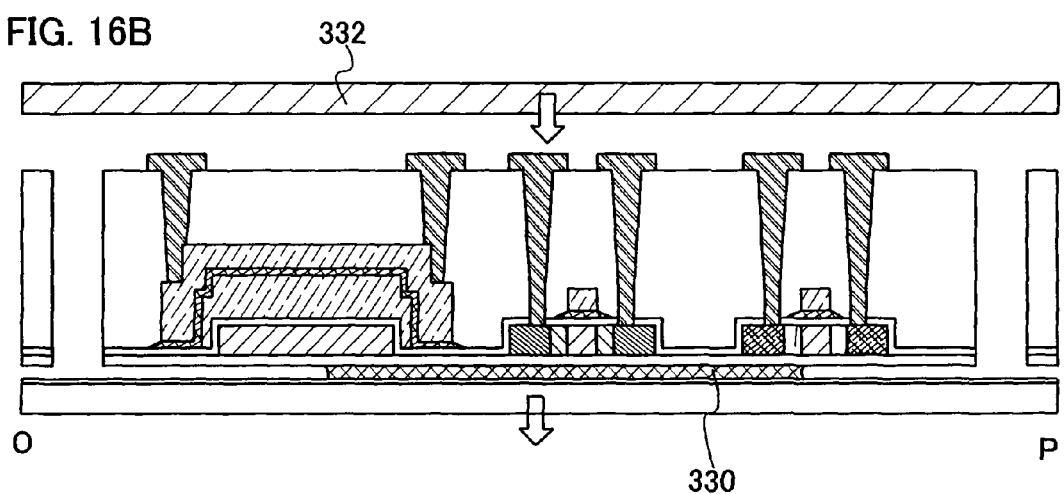
Figure 16C:
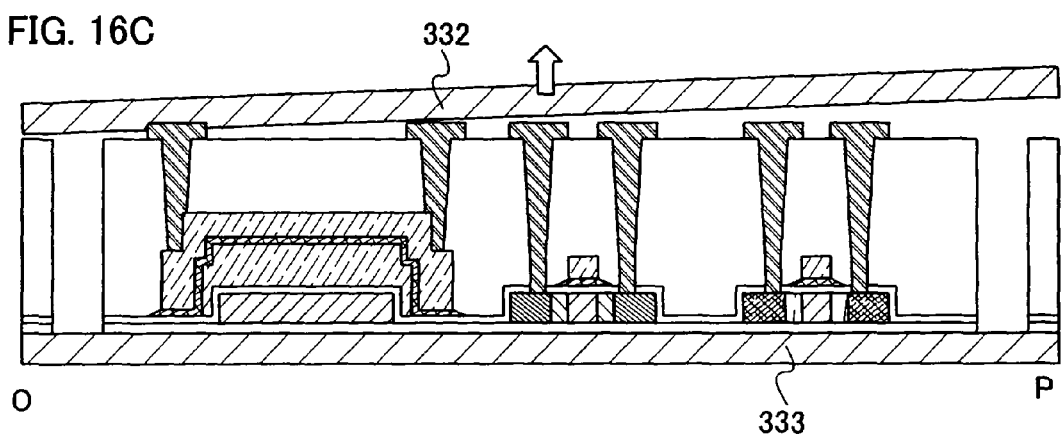

Then, etchant is introduced into the contact hole 331 to partially remove the peeling layer 330 (see FIG. 16B). Next, a substrate 332 for supporting the peeling is attached from a top surface direction of the substrate 301, and then the semiconductor element and the microstructure are peeled from the substrate 301 with the peeling layer 330 as a boundary. After that, the semiconductor element and the microstructure are transferred to the substrate 332. Next, a flexible substrate 333 is attached to a side where the semiconductor element and the microstructure were in contact with the substrate 301, i.e., the peeling surface. Then, by peeling the substrate 332 for peeling which has been pasted from the top surface direction, the semiconductor element and the microstructure can be transferred. It is to be noted that the substrate 332 may be film-like.

Subsequently, a contact hole is formed so as to expose the sacrifice layer and the sacrifice layer is etched away, thereby manufacturing the microstructure. In order to prevent the wire 316 and the like from reacting with etchant at the peeling, a protective film may be formed over the wire.

After the transfer, it is also possible to paste the aforementioned counter substrate 325 if the microstructure needs to be protected. The counter substrate 325 can be film-like.

Although this embodiment mode has described a method of transferring the semiconductor element and the microstructure to another flexible substrate 333 after etching the peeling layer 330 from the substrate 301, the present invention is not limited to this example. For instance, there are a method in which after the peeling layer 330 is removed only by the etching step, the semiconductor device is transferred to another substrate or the like or a method in which a substrate for peeling is pasted from a top surface of the substrate 301 without providing the peeling layer 330 and the semiconductor element and the microstructure are peeled off from the substrate 301. In addition, another method is given in which the semiconductor element and the microstructure are obtained by polishing the substrate 301 from its rear surface. It is also possible to combine these methods appropriately. The methods for transferring the semiconductor device to another flexible substrate 333 other than the method in which the substrate 301 is polished from its rear surface have an advantage that the substrate 301 can be reused.

As mentioned above, a thin, soft, and compact semiconductor device can be manufactured by peeling the semiconductor element and the microstructure manufactured over the substrate 301 and pasting them to the flexible substrate 333.

Crystallization can be carried out at lower temperature by laser crystallization or a combination of laser crystallization and a metal element than by crystallization using only heat. Thus, a material range applicable in the process can be widened. For example, if the semiconductor layer is crystallized only by heat, the heating needs to be carried out at about 1000° C. for about 1 hour; therefore a glass substrate sensitive to heat or a metal element with its melting point of 1000° C. or lower cannot be used. However, the aforementioned step using the metal element makes it possible to use a glass substrate and the like having a distortion point of 593° C.

Compared with a semiconductor layer obtained by only thermal crystallization, the semiconductor layer manufactured by the above step has continuous crystal grain boundaries; therefore, covalent bonds are also continuous. Thus, stress concentration that is generated because of defects caused by unpaired bond between the grain boundaries does not occur, which increases breaking stress as compared with normal polycrystalline silicon.

Moreover, since amorphous silicon generally has internal residual stress after film formation, it is difficult to form amorphous silicon thick. Meanwhile, since polycrystalline silicon manufactured by the above steps can have internal stress relaxed and can be formed at low temperature, a semiconductor layer having arbitrary thickness can be formed by repeating film formation and crystallization. Moreover, another material can be patterned over the semiconductor layer and another semiconductor layer can be formed thereover.

It is known that silicon alloy such as nickel silicide has high strength in general. By selectively leaving the metal element used for the crystallization in the semiconductor layer and applying appropriately a heat treatment, a microstructure which is harder and has a higher conductive property can be manufactured. Therefore, this method is superior in the case of using the semiconductor layer as an electrode of a lower part of the microstructure as described in this embodiment mode.

In addition, the present invention can provide a semiconductor device which does not require to be assembled or packaged and which does not require high manufacturing cost, by manufacturing the microstructure and the semiconductor element over one substrate.

This embodiment mode can be freely combined with the above embodiment mode.

EMBODIMENT MODE 12

Embodiment Mode 12 will describe specific structure and usage of the semiconductor device explained in the above embodiment mode, with reference to the drawings.

Here, an example of a semiconductor device, which is a medical device having a function of sending detected functional data of a biological body through wireless communication, injecting a medical agent to an affected area of disease, sampling a cell of the affected area, and so on, will be described with reference to FIGS. 17A to 17D.

Figure 17A:
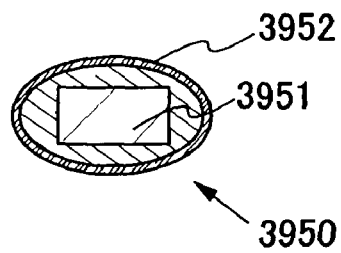
FIGS. 17A to 17D show usage of a semiconductor device of the present invention.

A medical device 3950 shown in FIG. 17A is provided with a semiconductor device 3951 of the present invention within a capsule 3952 coated with a protective layer. A space between the capsule 3952 and the semiconductor device 3951 may be filled with a filler 3953.

Figure 17B:
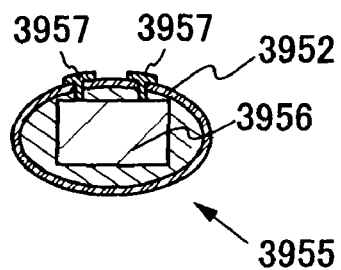

A medical device 3955 shown in FIG. 17B is provided with the semiconductor device 3951 of the present invention within the capsule 3952 coated with a protective layer. A microstructure 3956 in the semiconductor device is wholly or partially exposed to the outside of the capsule 3952. A space between the capsule 3952 and the semiconductor device 3951 may be filled with the filler 3953.

It is preferable that the protective layer for coating the surface of the capsule contain diamond-like carbon (DLC), silicon nitride, silicon oxide, silicon oxynitride, or carbon nitride. Known capsule and filler can be appropriately used. By providing the capsule with the protective layer, it is possible to prevent the capsule and semiconductor device from being dissolved or changing in quality within a body.

Moreover, when the outermost surface of the capsule has a round shape like an ellipse, the capsule can be used safely without damaging a human body.

The semiconductor device 3951 included in the medical devices 3950 and 3955 has the structure mentioned in the above embodiment mode, and a sensor, a pump, a sampling structure, and the like are made by using a microstructure. The microstructure has a sensor for detecting functional data of a biological body by measuring a physical amount or a chemical amount, a pump for injecting a medical agent to the affected area of disease, a sampler for sampling a cell of the affected area, and the like.

If the physical amount to be detected by the medical device is pressure, light, an acoustic wave, or the like, a semiconductor device of which an electrode is not exposed to the outside of a capsule, like the one shown in FIG. 17A, can be used. Moreover, if temperature, flow rate, magnetism, acceleration, humidity, a chemical substance such as a gas constituent or liquid constituent like an ion, or the like is detected, a semiconductor device of which the microstructure 3956 is exposed to the outside of the capsule like the one shown in FIG. 17B is preferably used. Moreover, even in the case of the medical device having a pump for injecting a medical agent to the affected area or a sampler for sampling, it is preferable that the microstructure shown in FIG. 17B be exposed to the outside of the capsule.

It is also possible to perform, by an electric circuit, signal conversion and information processing of information obtained by the microstructure. Further, it is possible to provide a sophisticated function like judging, based on the information obtained by the microstructure, whether or not the semiconductor device moves around to seek the affected area of disease and the semiconductor device injects a medical agent by observing the affected area, depending on a structure of the electric circuit in the semiconductor device.

The information obtained by the microstructure and the signal processed by the electric circuit can be sent to a reader/writer through an RF circuit. Moreover, it is possible to send a control signal through wireless communication to a semiconductor device operating in the body. Since the semiconductor device can supply electric power and communicate wirelessly by having an RF circuit, it becomes possible to increase the degree of freedom of a medical treatment and to decrease pain given to patients (like the pain given by gastro-cameras).

If the medical device is a device for taking an image inside a body, the medical device may be provided with a light-emitting device like an LED (Light Emitting Diode) or an EL. As a result, it is possible to take an image inside a body.

In order to autonomously send data of a detection result from the medical device to the reader/writer, a detection device may be provided with a known battery.

Figure 17C:
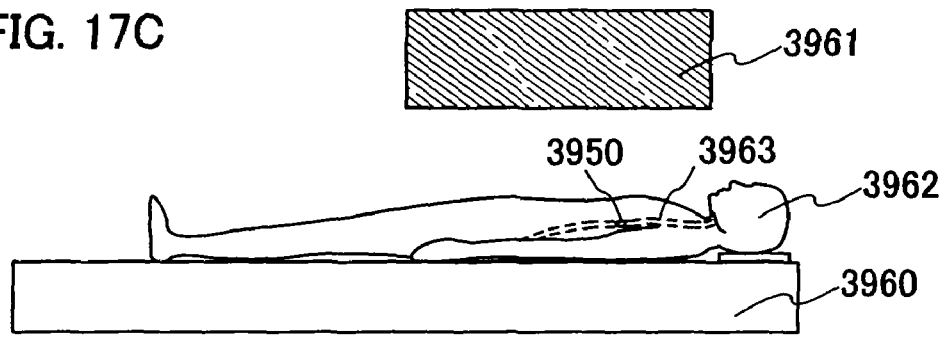

Next, a method of using the medical device is described. As shown in FIG. 17C, an examinee 3962 swallows the medical device 3950 or 3955 and let the medical device 3950 or 3955 move inside a cavity 3963 in a body. A result detected by the microstructure in the semiconductor device is sent to the reader/writer 3961 provided near the examinee. This result is received with the reader/writer. As a result, it is possible to detect functional data of the biological body of the examinee at this place without collecting the semiconductor device. Moreover, images inside the cavity of the body and digestive apparatus can be taken.

Although the above example has shown the inspection of a digestive apparatus by swallowing the medical device, the present invention is not limited to this. For example, by manufacturing a very small medical device (for instance, about several μm to several hundred μm), it is possible to insert the medical device within a blood vessel or an abdominal cavity.

Figure 17D:
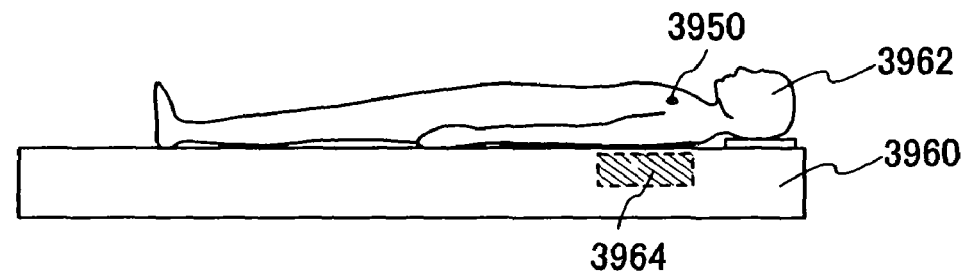

Moreover, as shown in FIG. 17D, by embedding the medical device 3950 or 3955 inside the examinee 3962, a result detected by the microstructure of the semiconductor device is sent to a reader/writer 3964 provided near the examinee. In this case, the medical device 3955 is embedded in a body so that an electrode 3957 is in contact with a target area to be measured of the examinee. The medical device embedded in the body can be fixed to any location by using a biobond or the like.

This result is received with the reader/writer. This received result is recorded in a computer for controlling biological information and processed therein, whereby the biological information of the examinee can be controlled. By providing the readier/writer 3964 to a bed 3960, it is possible to detect, in any time, biological information of examinees who suffer from dysfunction and have difficulty in moving around and to control medical states or health conditions of the examinees.

This embodiment mode can be freely combined with the above embodiment mode.

EMBODIMENT

This embodiment will show mechanical characteristics on a structural layer formed by using a semiconductor layer, like the structural layer 205 shown in Embodiment Mode 4 with reference to FIGS. 5A to 8C.

For example, as shown in FIG. 6B, the structural layer 205 in the structure can be formed by stacking a layer having polycrystalline silicon crystallized by the above step and a layer having amorphous silicon. Silicon layers having different crystal conditions like the layer having polycrystalline silicon and the layer having amorphous silicon are layers having mechanical characteristics which are different from each other. Therefore, when the structural layer is formed by stacking the layers like in the above example or forming the structural layer in selective regions within the same layer, structures in accordance with various purposes can be manufactured.

In order to examine the difference in the mechanical characteristics of silicon layers having different crystal conditions, measurement is conducted on combined elastic modulus and indentation hardness for a layer having amorphous silicon formed by a CVD method and a layer having polycrystalline silicon. Here, the layer having polycrystalline silicon is obtained by crystallizing a layer having amorphous silicon through laser crystallization using a metal element.

The layer having amorphous silicon used as a sample is formed by forming a 50-nm-thick silicon nitride layer and a 100-nm-thick silicon oxide layer as base layers by a CVD method, and forming a 66-nm-thick amorphous silicon layer by a CVD method, over a quartz substrate. The layer having polycrystalline silicon used as a sample is obtained by crystallizing, with the use of a continuous wave laser, a layer having amorphous silicon formed similarly to the above using a metal element. The energy density of the laser used for the crystallization ranges from 9 to 9.5 W/cm² and the scan speed thereof is set to 35 cm/s. The thickness of the layer having polycrystalline silicon crystallized by laser irradiation becomes about 60 nm because of shrink of the film.

Measurement of the mechanical characteristics is conducted by nanoindentation measurement in which an indenter with a triangular pyramid shape is pressed into a sample. A condition for the measurement is a single press of an indenter and an indenter to be used is a Berkovich indenter made of diamond. Therefore, the elastic modulus of the indenter is about 1000 GPa with a Poisson's ratio of about 0.1.

The combined elastic modulus that is measured is obtained by combining the elastic modulus of the sample and the indenter, which is expressed as the following formula (1). In the formula (1), Er is combined elastic modulus, E is Young's modulus, and v is Poisson's ratio. A first term in the formula (term shown by a sample) is a term to which the elastic modulus of the sample contributes, and a second term (term shown by an indenter) is a term to which the elastic modulus of the indenter contributes.

$$\frac{1}{Er} = \left(\frac{1-v^2}{E}\right)_{sample} + \left(\frac{1-v^2}{E}\right)_{indenter} \quad (1)$$

As shown in the formula (1), the combined elastic modulus is obtained from the sum of the first term to which the elastic modulus of the sample contributes and the second term to which the elastic modulus of the indenter contributes. However, since the elastic modulus of the indenter is much higher than that of the sample, the second term can be ignored so that the combined elastic modulus approximately shows the elastic modulus of the sample.

Moreover, the indentation hardness is hardness measured by an indentation method, obtained by dividing the maximum press fit weight of the indenter by a projection area at the maximum press fit. Here, the projection area at the press fit is obtained by a geometric shape of the indenter and a contact depth when the indenter presses the sample. By multiplying this indentation hardness by 76, it can be treated equally to Vickers hardness, which is generally used as an indicator of hardness.

Chart 1 shows a measurement result of combined elastic modulus and indentation hardness of a layer having polycrystalline silicon and a layer having amorphous silicon. The result shows an average value of three measurement results.

CHART 1

| sample | combined elastic modulus (GPa) | indentation hardness (GPa) |
| --- | --- | --- |
| layer having amorphous silicon | 141 | 15.5 |
| layer having polycrystalline silicon | 153 | 20.3 |

According to the result shown in Chart 1, the layer having polycrystalline silicon has higher elastic modulus than the layer having amorphous silicon. In other words, Chart 1 indicates that, in the case where bending force acts in the structural layer, the layer having polycrystalline silicon has stronger resistance against bending than the layer having amorphous silicon.

Moreover, the result shown in Chart 1 indicates that the layer having polycrystalline silicon is harder than the layer having amorphous silicon.

By stacking semiconductor layers having different elastic modulus and hardness, it is possible to manufacture a structure having both of hardness and flexibility that is resistant against bending. For example, even though breaking from crystal defects of the layer having polycrystalline silicon occurs, the breaking is unlikely to spread to the layer having amorphous silicon; therefore, the breaking can be stopped before the layer having amorphous silicon. Thus, the balance on the flexibility and hardness can be determined according to the ratio of the thicknesses of the stacked layers.

By having the silicon layers having different properties, stacking layers of silicon compounds, or partially forming the layers of silicon compounds, a structure having structural layers having desired properties like flexibility, hardness, a conductive property, or the like can be manufactured.

This application is based on Japanese Patent Application serial no. 2005-178612 filed in Japan Patent Office on Jun. 17, 2005, the entire contents of which are hereby incorporated by reference.

What is claimed is:

1. A semiconductor device comprising:
    a microstructure over an insulating surface, comprising a structural layer and a space between the structural layer and the insulating surface, wherein the structural layer comprises polycrystalline silicon having continuous grain boundaries;
    an electric circuit comprising a semiconductor element over the insulating surface; and
    an antenna over the microstructure and the electric circuit; wherein the antenna and the microstructure are electrically connected to the electric circuit, respectively.

2. A semiconductor device according to claim 1, wherein the structural layer is movable in the space.

3. A semiconductor device according to claim 1, wherein the structural layer comprises polycrystalline silicon obtained by laser crystallization or thermal crystallization using a metal element.

4. A semiconductor device according to claim 1, wherein the semiconductor element comprises polycrystalline silicon.

5. A semiconductor device according to claim 1, wherein the structural layer has a multilayer structure of the polycrystalline silicon and amorphous silicon.

6. A semiconductor device according to claim 1, wherein the structural layer has a multilayer structure of the polycrystalline silicon and silicide including silicon and a metal element.

7. A semiconductor device according to claim 1, wherein the structural layer has a multilayer structure of the polycrystalline silicon, amorphous silicon, and silicide including silicon and a metal element.

8. A semiconductor device according to claim 1, wherein the structural layer includes a region having the polycrystalline silicon and a region having amorphous silicon in the same layer.

9. A semiconductor device according to claim 1, wherein the structural layer includes a region having the polycrystalline silicon and a region having silicide including silicon and a metal element in the same layer.

10. A semiconductor device according to claim 1, wherein the structural layer includes a region having the polycrystalline silicon, a region having amorphous silicon, and a region having silicide including silicon and a metal element in the same layer.

11. A semiconductor device according to claim 3, wherein the metal element is one or more selected from Ni, Fe, Ru, Rh, Pd, Os, Ir, Pt, Cu, and Au.

12. A semiconductor device according to claim 1, wherein the antenna is electrically connected to the semiconductor element of the electric circuit.

13. A semiconductor device according to claim 1, further comprising:
a counter substrate so as to face the insulating surface; and
a protective layer over the microstructure, which is provided in a region of the counter substrate where the microstructure is not provided.

14. A semiconductor device according to claim 1, wherein the microstructure has a first space provided between the structural layer and the insulating surface and a second space between the structural layer and a layer provided over the structural layer, and wherein the first space and the second space overlap with each other.

15. A semiconductor device according to claim 1, wherein the polycrystalline silicon is patterned into a polygonal shape whose corner is round when viewed from above.

16. A semiconductor device according to claim 1, wherein the polycrystalline silicon is formed so that a cross section has a tapered angle.

17. A semiconductor element comprising:
a microstructure over an insulating surface, comprising a lower layer having a conductive property, a structural layer over the lower layer, and a space between the structural layer and the lower layer, wherein the structural layer comprises polycrystalline silicon having continuous grain boundaries;
an electric circuit comprising a semiconductor element over the insulating surface; and
an antenna over the microstructure and the electric circuit;
wherein the antenna and the microstructure are electrically connected to the electric circuit, respectively.

18. A semiconductor device according to claim 17, wherein the structural layer is movable in the space.

19. A semiconductor device according to claim 17, wherein one of the lower layer and the structural layer comprises polycrystalline silicon obtained by laser crystallization or thermal crystallization using a metal element.

20. A semiconductor device according to claim 17, wherein the semiconductor element comprises polycrystalline silicon.

21. A semiconductor device according to claim 17, wherein the lower layer includes a metal element, a compound of the metal element, silicide including the metal element and silicon, or silicon having an impurity.

22. A semiconductor device according to claim 17, wherein the structural layer has a multilayer structure of the polycrystalline silicon and amorphous silicon.

23. A semiconductor device according to claim 17, wherein the structural layer has a multilayer structure of the polycrystalline silicon and silicide including silicon and a metal element.

24. A semiconductor device according to claim 17, wherein the structural layer has a multilayer structure of the polycrystalline silicon, amorphous silicon, and silicide including silicon and a metal element.

25. A semiconductor device according to claim 17, wherein the structural layer includes a region having the polycrystalline silicon and a region having amorphous silicon in the same layer.

26. A semiconductor device according to claim 17, wherein the structural layer includes a region having the polycrystalline silicon and a region having silicide including silicon and a metal element in the same layer.

27. A semiconductor device according to claim 17, wherein the structural layer includes a region having the polycrystalline silicon, a region having amorphous silicon, and a region having silicide including silicon and a metal element in the same layer.

28. A semiconductor device according to claim 19, wherein the metal element is one or more selected from Ni, Fe, Ru, Rh, Pd, Os, Ir, Pt, Cu, and Au.

29. A semiconductor device according to claim 17, wherein the antenna is electrically connected to the semiconductor element of the electric circuit.

30. A semiconductor device according to claim 17, further comprising:
a counter substrate so as to face the insulating surface; and
a protective layer over the microstructure, which is provided in a region of the counter substrate where the microstructure is not provided.

31. A semiconductor device according to claim 17, wherein the microstructure has a first space provided between the structural layer and the insulating surface and a second space between the structural layer and a layer provided over the structural layer, and wherein the first space and the second space overlap with each other.

32. A semiconductor device according to claim 17, wherein the polycrystalline silicon is patterned into a polygonal shape whose corner is round when viewed from above.

33. A semiconductor device according to claim 17, wherein the polycrystalline silicon is formed so that a cross section has a tapered angle.

* * * * *

UNITED STATES PATENT AND TRADEMARK OFFICE
CERTIFICATE OF CORRECTION

PATENT NO. : 7,642,612 B2  
APPLICATION NO. : 11/424456  
DATED : January 5, 2010  
INVENTOR(S) : Izumi et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 646 days.

Signed and Sealed this

Twenty-first Day of December, 2010

David J. Kappos  
*Director of the United States Patent and Trademark Office*